United States Patent [19]
Burgener

[11] Patent Number: 5,863,823
[45] Date of Patent: Jan. 26, 1999

[54] SELF-ALIGNED EDGE CONTROL IN SILICON ON INSULATOR

[75] Inventor: Mark L. Burgener, San Diego, Calif.

[73] Assignee: Peregrine Semiconductor Corporation, San Diego, Calif.

[21] Appl. No.: 408,750

[22] Filed: Mar. 21, 1995

Related U.S. Application Data

[63] Continuation-in-part of Ser. No. 90,400, Jul. 12, 1993, Pat. No. 5,416,043.

[51] Int. Cl.$^6$ .................................................. H01L 21/336
[52] U.S. Cl. .......................... 438/295; 438/297; 438/298; 438/410; 438/517
[58] Field of Search .................................. 437/63, 61, 62, 437/69, 28; 438/295, 297, 298, 299, 410, 517

[56] References Cited

U.S. PATENT DOCUMENTS

| | | |
|---|---|---|
| 3,562,425 | 2/1971 | Poirier . |
| 3,699,544 | 10/1972 | Joynson et al. . |
| 3,829,743 | 8/1974 | Kohashi . |
| 3,829,881 | 8/1974 | Kohashi . |
| 4,037,140 | 7/1977 | Eaton, Jr. . |
| 4,065,781 | 12/1977 | Gutknecht . |
| 4,177,084 | 12/1979 | Lau et al. . |
| 4,183,134 | 1/1980 | Oehler et al. ............................ 29/571 |
| 4,198,649 | 4/1980 | Berry . |
| 4,282,556 | 8/1981 | Ipri . |
| 4,385,937 | 5/1983 | Ohmura . |
| 4,418,470 | 12/1983 | Naster et al. . |
| 4,420,743 | 12/1983 | Upadhyayula . |
| 4,425,700 | 1/1984 | Sasaki et al. . |
| 4,463,492 | 8/1984 | Maeguchi . |
| 4,509,990 | 4/1985 | Vasudev . |
| 4,523,963 | 6/1985 | Ohta et al. . |
| 4,549,198 | 10/1985 | Kondo . |
| 4,588,447 | 5/1986 | Golecki . |
| 4,598,305 | 7/1986 | Chiang et al. . |
| 4,607,176 | 8/1986 | Burrows et al. . |
| 4,615,762 | 10/1986 | Jastrzebski et al. . |
| 4,617,066 | 10/1986 | Vasudev . |
| 4,659,392 | 4/1987 | Vasudev . |

(List continued on next page.)

FOREIGN PATENT DOCUMENTS

| | | |
|---|---|---|
| 0 273 702 | 7/1988 | European Pat. Off. . |
| 0 600 596 | 6/1994 | European Pat. Off. . |
| 0 605 946 | 7/1994 | European Pat. Off. . |
| 2 380 637 | 2/1978 | France . |
| 2 380 637 | 9/1978 | France . |
| 56-90549 | 7/1981 | Japan . |

(List continued on next page.)

OTHER PUBLICATIONS

International Search Report Dated May 14, 1996, International Application No. PCT/US 96/00139.
Patent Abstracts of Japan, vol. 008, No.074 (E–236), Apr. 6, 1984 & JP,A,58 222573 (Hitachi Seisakusho KK; Others: 01), Dec. 24, 1983.
Reedy et al., "Thin (100 nm) SOS for Application to Beyond VLSI Microelectronics," *Materials Research Society Symp. Proc.* vol. 107, Nov./Dec. 1988, pp. 365–376.
G. Garcia et al., "High–Quality CMOS in Thin (100 nm) Silicon on Sapphire," *IEEE Electron Device Letters,* vol. 9, No. 1, Jan., 1988, pp. 32–34.

(List continued on next page.)

*Primary Examiner*—Trung Dang
*Attorney, Agent, or Firm*— Wilson Sonsini Goodrich & Rosati

[57] ABSTRACT

An improved process and structure for channel stop in silicon on insulator using LOCOS isolation are disclosed. Advantages include decreased ion dose requirements; reduced processing time; smaller ΔW characteristics, thus, small transistor size and more precise process control over the edge of a MOSFET. The process also makes possible a wide range of transistor design capabilities and improved transistor operating parameters.

16 Claims, 23 Drawing Sheets

U.S. PATENT DOCUMENTS

| | | |
|---|---|---|
| 4,717,836 | 1/1988 | Doyle . |
| 4,766,482 | 8/1988 | Smeltzer et al. . |
| 4,775,641 | 10/1988 | Duffy et al. . |
| 4,843,442 | 6/1989 | Boudou et al. . |
| 4,843,448 | 6/1989 | Garcia et al. . |
| 4,851,721 | 7/1989 | Okitaka . |
| 4,872,010 | 10/1989 | Larson et al. . |
| 4,876,582 | 10/1989 | Janning . |
| 4,907,041 | 3/1990 | Huang . |
| 4,989,057 | 1/1991 | Lu . |
| 5,027,171 | 6/1991 | Reedy et al. . |
| 5,141,882 | 8/1992 | Komori et al. . |
| 5,166,767 | 11/1992 | Kapoor et al. . |
| 5,170,373 | 12/1992 | Doyle et al. . |
| 5,196,802 | 3/1993 | Burgener et al. . |
| 5,229,644 | 7/1993 | Wakai et al. . |
| 5,242,849 | 9/1993 | Sato . |
| 5,294,823 | 3/1994 | Eklund et al. . |
| 5,300,443 | 4/1994 | Shimabukuro et al. . |
| 5,313,077 | 5/1994 | Yamakazi . |
| 5,341,009 | 8/1994 | Young et al. . |
| 5,391,903 | 2/1995 | Strater et al. . |
| 5,416,043 | 5/1995 | Burgener ................................. 437/62 |
| 5,445,802 | 8/1995 | Tyson et al. ............................. 437/62 |

FOREIGN PATENT DOCUMENTS

| | | |
|---|---|---|
| 57-197848 | 4/1982 | Japan . |
| 60-74454 | 4/1985 | Japan . |
| 61-103530 | 5/1986 | Japan . |
| 63-176145 | 8/1987 | Japan . |
| 4-122020 | 4/1992 | Japan . |
| 5-55470 | 3/1993 | Japan . |
| 2 005 073 | 9/1978 | United Kingdom . |
| A 2021346 | 11/1979 | United Kingdom . |
| WO 89/07367 | 8/1989 | WIPO . |
| WO 95 02892 | 1/1995 | WIPO . |
| WO A 95 02892 | 1/1995 | WIPO . |

OTHER PUBLICATIONS

P.R. de la Houssaye et al., "Fabrication of n –channel metal–oxide–semiconductor field–effect transistors with 0.2 μm gate lengths in 500Å thin film silicon on sapphire," *Journal of Vacuum Science& Technology B*, vol. 10, No. 6, Nov./Dec. 1992, pp. 2954–2957.

H. Woerlee et al., "Half–micron CMOS on Ultra–thin Silicon on Insulator," *Technical Digest of the International Electron Devices Meeting*, Dec. 3, 1989, pp. 821–824.

N, Sasaki et al., "A CMOS/SOS Synchronous Static RAM Fabricated with an Advanced SOS Technology," *Japanese Journal of Applied Physics*, vol. 18 (1979), Supplements 18–1, pp. 57–62 (Source: Search Report from International Appl. PCT/US94/06626).

King et al., "A low–temperature ($\leq 550$ C) silicon–germanium MOS thin–film transistor technology for large–area electronics," *Technical Digest of the International Electron Devices Meeting*, Dec. 8–11, 1991, pp. 567–570. (Source: Search Report from International Appl. PCT/US94/06626).

I. Golecki et al., "Recrystallization of silicon–on–sapphire by cw A laser irradiation: Comparison between the solid–and the liquid–phase regimes," *Applied Physics Letters*, 37 (10) Nov. 15, 1980, pp. 919–921.

T. Inoue et al., "Crystalline disorder reduction and defect–type change in silicon on sapphire films by silicon implantation and subsequent thermal annealing," *Applied Physics Letters* 36 (1) Jan. 1, 1980, pp. 64–67. (source: IDS in 08/218,561 & 08/090,400).

Golecki et al., "Improvement of crystalline quality of epitaxial silicon–on–sapphire by ion implantation and furnace regrowth," *Solid–State Electronics*, vol. 23, pp. 803–806. (Source: IDS in 08/218.561 & 08/090,400).

J. Linnros et al., "Ion–beam–induced epitaxial regrowth of amorphous layers in silicon on sapphire," *The American Physical Society*, vol. 30. No. 7, Oct. 1, 1984, pp. 3629–3638.

S. Lau et al., "Improvement of crystalline quality of epitaxial Si layers by ion–implantation techniques," *Applied Physics Letters*, 34 (1), Jan. 1, 1979, pp. 76–78. (source: IDS in 08/218,561 & 08/090,400).

S.M. Sze, *Physics of Semiconductor Devices*, Second Edition, John Wiley & Sons, Taipei, Taiwan, Section 8.4.3.–8.4.4 at pp. 344, 360, 477–485. (cited in application on p. 33).

R. Reedy et al., "Characterization of Defect Reduction and Aluminum Redistribution in Silicon Implanted SOS Films," *Journal of Crystal Growth*, North–Holland Publishing Co., vol. 58, No. 1, Jun. 1982, pp. 53–60. (source: IDS in 08/218.561 & 08/090,400).

R. Reedy et al., "Suppressing Al outdiffusion in implantation and recrystallized silicon on sapphire films," *Appl. Phys. Lett.* 42(8), 15 Apr. 1983, pp. 707–709.

A. Schmitz et al., "A Deep–Submicrometer Microwave/ Digital CMOS/SOS Technology," *IEEE Electron Device Letters*, (1991) Jan., vol. 12, No. 1, New York, pp. 16–17.

J. Lee et al., "Threshold adjustments for complementary metal–oxide–semiconductor optimization using B and As focused ion beams," *Appl. Phys. Lett.* 48 (10), 10 Mar. 1986, pp. 668–669.

Jean–Pierre Colinge, *Silicon–on–Insulator Technology: Materials to VLSI*, Kluwer Academic Publishers, 1991, p. 112.

H. Nishizawa et al., An Advanced Dielectric Isolation Structure for SOI–CMOS VLSIs, Abstract No. 822, 1046b Extended Abstracts, Spring Meeting, (1993) May 16–21, Honolulu, 93/1 (1993) Pennington, NJ, US, pp. 1201–1202.

S. Cohen et al., "An Improved Input Protection Circuit for C–MOS/SOS Arrays,"IEEE Transactions on Electron Devices, Vol. Ed. 25, No. 8 Aug. 1978.

S. Chan et al., "Comparison of ESD Protection Capability of SOI and BULK CMOS Output Buffers," 1994 IEEE International Reliability Physics Proceedings, 32nd Annual, San Jose, CA Apr. 12–14, 1994, pp. 292–297.

J. Whitehead and N. Duncan, "Design and Evaluation of CMOS–SOS On–Chip Input Protection Circuits," pp. 4.2.1–4.2.10, GEC Research Limited, Hirst Research Centre, East Lane, Wembley, Middlesex HA9 7PP, United Kingdom.

W. Palumbo, M. Dugan, "Design and Characterization of Input Protection Networks for CMOS/SOS Applications," EOS/ESD Symposium Proceedings, 1986, pp. 182–187.

"Scaled Channel Length for N–Channel and P–Channel Transistors," *Microprocessor Forum, Microprocessor Report*, Nov. 12, 1992, pp. 1–10, and 4 pages drawings.

H. Veendrick, "Short–Circuit Dissipation of Static CMOS Circuitry and Its Impact on the Design of Buffer Circuits," *IEEE Journal of Solid–State Circuits*, vol. SC–19, No. 4, Aug. 1984.

T. Yamaguchi et al.: "Investigations of continuously variable threshold voltage devices (CVTD)," Solid State Devices, Proceedings of the 6th Conference on Solid State Devices, Tokyo, 1974, Supplement to the Journal of the Japan Society of Applied Physics, vol. 44, 1975, pp. 233–242 see abstract; p. 235, col. 2, line 34–p. 236, col. 1, line 2; p. 239, col. 2, line 26–p. 240, col. 2, line 11; figure 8a.

Patent Abstracts of Japan, vol. 007, no. 049 (E–161), Feb. 25, 1983 & JP,A,57 197848 (Tokyo Shibaura Denki KK), Dec. 4, 1982.

Patent Abstracts of Japan, vol. 005, No. 159(E–077), Oct. 14, 1981 and JP,A,56 090549 (Toshiba Corp.), Jul. 22, 1981.

Search Report dated Sep. 27, 1994, International Application No. PCT/US94/06626.

Search Report dated Jul 29, 1996 International Application No. PCT/US96/03823.

Search Report dated Jun. 24, 1996, International Application No. PCT/US96/01968.

M.L. Chen, et al., "Self–Registered Gradually Doped Source Drain Extension Short Channel CMOS?SOS Devices"IEEE Electron Device Letters, Dec. 12, 1982, vol. EDL–3, pp. 387–390.

Syed and Abidi, "Gigahertz Voltage–Controlled Ring Oscillator", Electronic Letters, 5th Jun., 1986, vol. 22, No. 12.

Stanley Wolf, "Silicon Processing for the VLSI Era, vol. 2—process Integration", 1990 Lattice Press, pp. 17–44, 327–331.

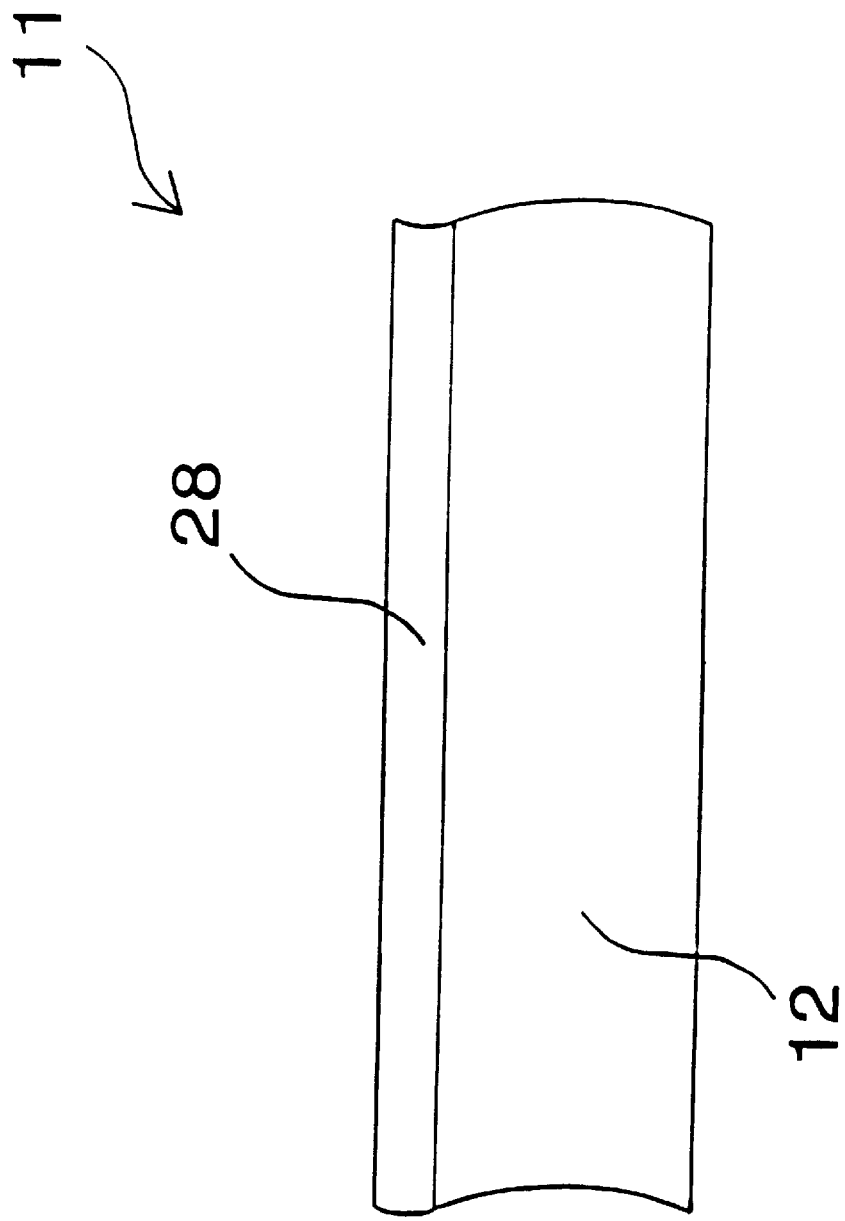

SELF-ALIGNED EDGE CONTROL IN SILICON ON INSULATOR

RELATED APPLICATION

This application is a continuation-in-part of patent application Ser. No. 08/090,400, filed Jul. 12, 1993, now U.S. Pat. 5,416,043, by inventors Burgener and Reedy, and entitled, "Minimum Charge FET Fabricated on an Ultrathin Silicon on Sapphire Wafer."

BACKGROUND

The field of the invention relates generally to the fabrication of semiconductor-on-insulator composite substrates, such as silicon-on-sapphire (SOS), and more particularly to a method and structure for fabricating transistors in integrated circuits provided in silicon-on-sapphire or other silicon-on-insulator material.

Local oxide isolation of silicon, referred to as LOCal Oxidation of Silicon (LOCOS), is the isolation technique most commonly used in present silicon-on-insulator (SOI) technology. The objective of LOCOS isolation and other conventional isolation techniques is to isolate transistors of opposite polarity from each other using a combination of ion implantation and thermal oxidation techniques. A LOCOS process is typically used for isolating complimentary metal oxide silicon (CMOS) transistors in SOI technology. However, as a result of isolating the active silicon islands containing transistors from one another with conventional LOCOS isolation methods, the implanted ions (typically boron) may diffuse beyond the edge or corner of the transistor, where such excess ions undesirably degrade transistor performance.

Intrinsic stresses at the edge of a nitride film give rise to horizontal forces that act on the substrate. Under some circumstances, such stress can exceed the critical stress for dislocation generation in silicon, and thus become a source of fabrication-induced defects. A pad oxide layer is used to combat stress and to avoid dislocation generation. The pad oxide layer reduces forces transmitted to the silicon at the nitride edge.

An example of the process for conventional LOCOS isolation techniques in SOI technology is shown in FIGS. 4A–4C. Active regions are defined with standard photolithography. A resist pattern is normally used to protect all of the areas of the silicon where active devices will be formed. The nitride layer is then dry etched, and the pad oxide is etched by means of either a dry or wet chemical process. After the pad oxide has been etched, the resist is not removed, but rather is left in place to serve as a masking layer during a channel stop implant step. An additional mask is required for blocking, for example, a boron implant over regions that do not require boron as shown in FIG. 4B.

An implant is next performed in the selected field regions to create a channel stop doping layer under the field oxide. In N-channel MOS (NMOS) transistors, a P$^+$ implant of boron is used. In P-channel MOS transistors (PMOS), an N$^+$ implant of arsenic or phosphorous is utilized. After the channel stop implant has been completed, the masking resist is stripped away.

The movement of boron into the active N-channel region after implantation and oxidation is referred to as the ΔW characteristic. Increases in boron dosage requirements result in larger ΔW characteristics, indicating substantial lateral boron diffusion. In order for a transistor to function with a large ΔW, it must be designed with significantly greater area to compensate for the increased amount of boron present within the transistor. Increasing the size of a transistor has the disadvantage of ultimately decreasing operating speed and increasing the cost per chip. Further, very large scale integration (VLSI) technology is not feasible with large transistors.

Another disadvantage of the conventional method of isolating active silicon islands is that the thickness of the silicon layer determines the time and temperature necessary to grow the oxide layer. However, such time and temperature characteristics may not be the same time and temperature parameters required to mobilize the implanted boron through the MOSFET, and into the edges. Consequently, the two separate sets of time and temperature characteristics affect one another. It is always desirable in wafer processing that each processing step be independent of the next step, in order to be able to change one processing step without affecting another.

Therefore, what is needed are improved process conditions in order to control edge transistor leakage, and in order to enhance a transistor's performance. It would be a significant advantage over current SOI LOCOS isolation processes if less lateral boron diffusion occurred in the edges of a transistor during processing, thereby resulting in smaller boron dose requirements. With a decrease in boron dosage, the ΔW would shrink, ultimately producing better transistor operating characteristics. Additionally, transistor size advantageously could be reduced.

It would be a significant advantage over typical SOI technology to implement an isolation process that would not only control, but substantially prevent edge transistor leakage. That is, it would be a significant advantage over conventional SOI LOCOS processes to substantially prevent lateral boron diffusion into a transistor. This advantageously would enable a process to use smaller boron doses and still obtain desired transistor performance.

Therefore, what is needed is an improved isolation process with minimum boron dose requirements to reduce or eliminate lateral diffusion. Decreasing boron dosages would reduce the ΔW, ultimately producing better transistor characteristics, including reducing transistor size. Such an improved isolation process should reduce fabrication process time and simplify manufacturing, thereby resulting in higher yields.

SUMMARY

To overcome the disadvantages of the above-described boron edge diffusion during conventional SOI LOCOS isolation, an aspect of the present invention describes process conditions and structure for controlling edge transistor leakage in ultrathin silicon-on-sapphire technology or in other forms of silicon-on-insulator technology. An aspect of the present invention further describes process conditions in which oxidation is performed prior to ion implantation, thereby ultimately decreasing boron dose requirements. This advantageously yields smaller ΔW characteristics, thereby reducing transistor size. This achieves a wider range of transistor design capabilities than is presently possible using conventional isolation methods.

BRIEF DESCRIPTION OF THE DRAWINGS

FIGS. 1A–1E illustrate steps in a process of converting an epitaxial silicon-on-sapphire wafer into a substantially pure silicon-on-sapphire wafer.

DESCRIPTION

The present invention will now be described with reference to the figures. Like reference numbers refer to like or similar regions depicted in the figures. The following description is presented to enable any person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

An aspect of the present invention comprises a method and structure for controlling lateral diffusion and edge transistor leakage in semiconductor-on-insulator devices and methods of making such devices. Aspects of the invention will be described with reference to the Figures. Like reference numbers refer to like or similar regions depicted in the Figures.

A semiconductor-on-insulator process or device according to the present invention might use an ultrathin intrinsic silicon film provided on an insulating sapphire substrate wherein the silicon film contains extremely low concentrations of charge states. Ideally, the intrinsic silicon contains no dopant atoms or electrically active states, either within the silicon film or at the interface between the silicon and the sapphire. While complete elimination of all charge states and dopant atoms is not feasible, trace amounts are acceptable within tolerances determined by the application. For example, if a threshold voltage is to be set to an accuracy of δ Volts, the total charge in the silicon film should be less than about $\delta/C_{ox}$, where $C_{ox}$ is the gate oxide capacitance per unit area. Other tolerances can be determined similarly. For example, if the threshold voltage is to be accurate to within $\Delta V_t = 50$ mV (0.05 V) of the desired value as determined by the metal work function, and a 5 nm thick $SiO_2$ dielectric layer is the gate insulator, then the total number of fixed charges ΔN (i.e., dopant charge plus band gap states plus interface states plus fixed charge in the insulators) in the structure should be less than $\Delta V_t C_{ox}/q$, where q is the charge on the electron. Thus, in this example, ΔN should be less than approximately $2 \times 10^{11}$ cm², which is typical of most current devices. However, certain applications may require tighter threshold voltage control, thereby requiring that the total allowable fixed charge in the silicon film be less than approximately $3 \times 10^{11}$ cm² while other applications may tolerate total allowable fixed charge up to as much as $5 \times 10^{11}$ cm².

Figure 1A:
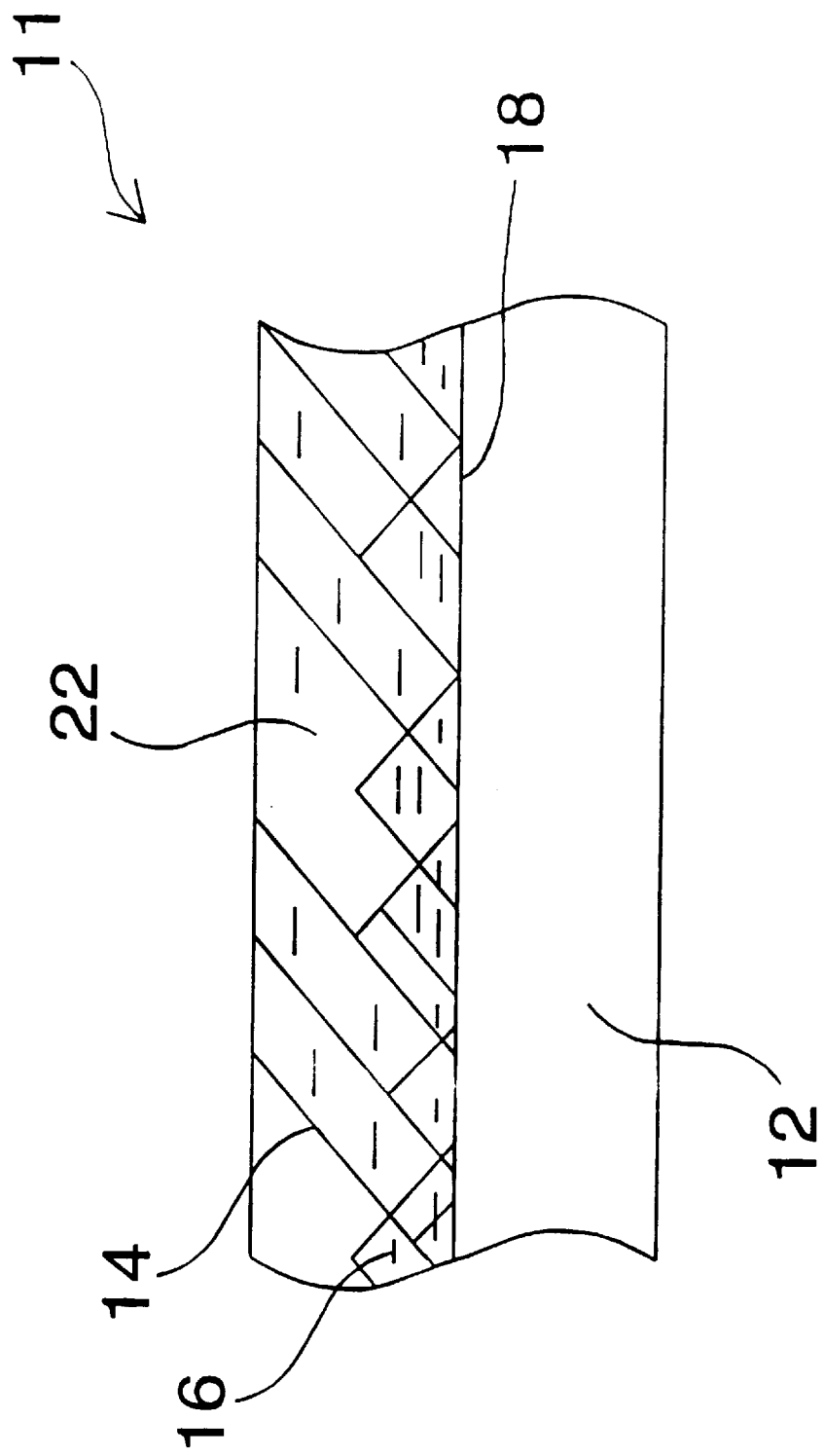

As shown in FIG. 1A, a 270 nm thick intrinsic silicon film 22 is deposited on a sapphire substrate 12 by epitaxial deposition to form a silicon-on-sapphire wafer 11. After the epitaxial deposition, the silicon film 22 contains a concentration of twin defects 14 and electrically active states 16. The thickness of the silicon film 22 is controlled during the epitaxial deposition process using standard processes.

Figure 1B:
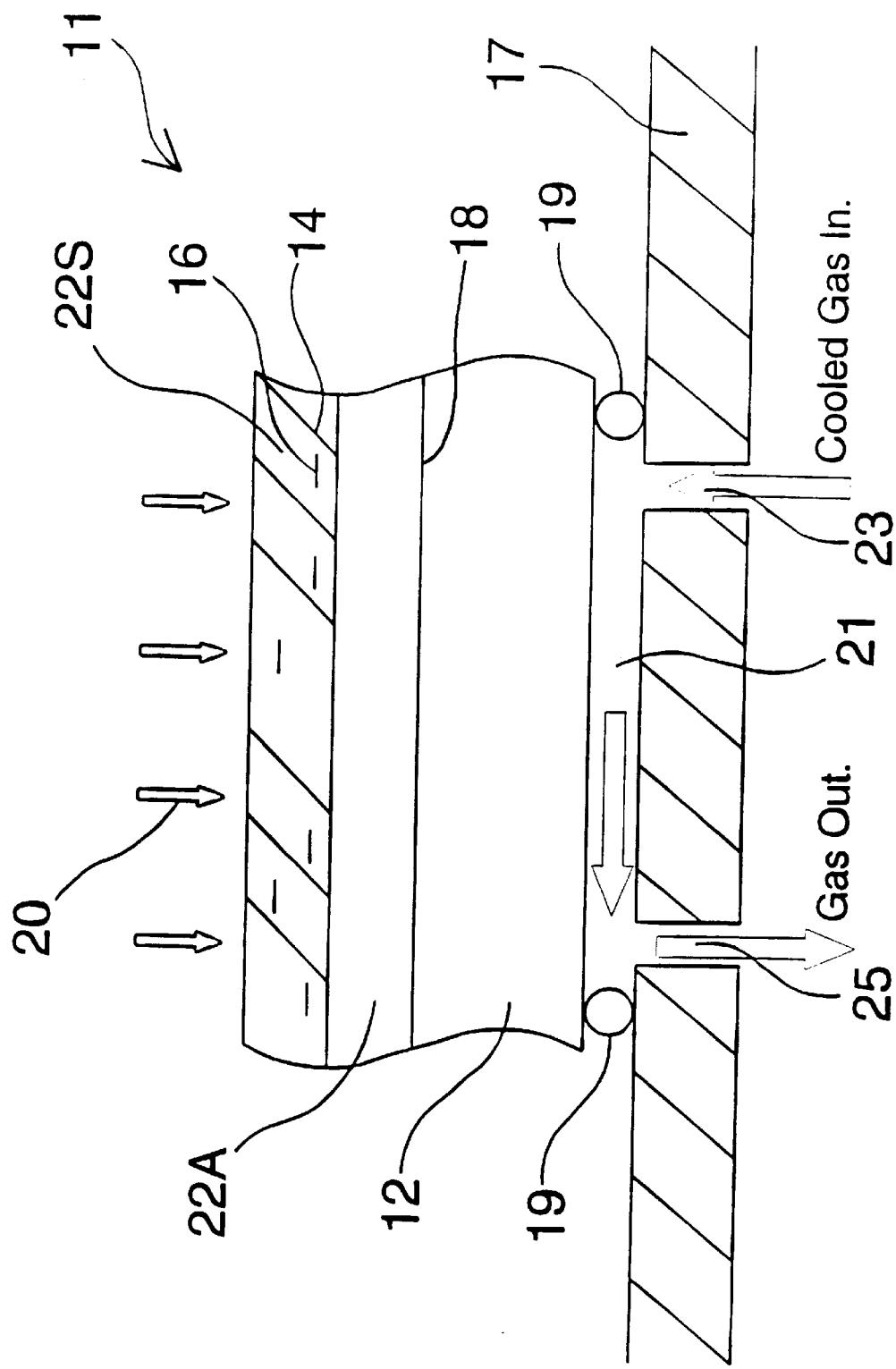

Referring to FIG. 1B, a 185 keV beam of silicon ions 20 is implanted into the silicon film 22 to a dose of approximately $6 \times 10^{14}$ cm², thus creating a subsurface amorphous region 22A and leaving a surface monocrystalline silicon region 22S. The energy and dose of the beam of silicon ions 20 are selected so that the amorphous region 22A extends from an interface 18 formed between the sapphire substrate 12 and the silicon film 22 up into the silicon film 22 to a thickness which is greater than the desired final thickness of silicon film. In this embodiment, the amorphous region 22A is approximately 200 nm thick.

The amorphous region 22A in the 270 nm thick intrinsic silicon film 22 is created by implantation with the silicon ion beam having an energy of 185 keV at a dose of $6 \times 10^{14}$ cm² while maintaining the silicon film 22 at a uniform temperature at or below about 0° C. It has been found that this process will uniformly amorphize layer 22A without causing aluminum atoms to be released from the sapphire substrate 12 into the silicon film 22. While others have reported cooling the substrate by placing it on a cooled heat sink during implantation, none have paid particular attention to the temperature of the silicon film 22 during the implantation, neither have they adequately addressed the issue of uniform cooling of the silicon film.

Previous cooling techniques include various techniques for placing the sapphire substrate 12 in contact with a cooled heat sink. Contact between the sapphire substrate and the heat sink was accomplished in a variety of ways including the use of a thermal paste layer interposed between the sapphire and the heat sink; depositing a layer of indium on the sapphire to provide more uniform contact with the heat sink; polishing the sapphire surface to improve contact with the heat sink, etc. However, these techniques created other problems and have been found to be inadequate for forming silicon films free of defects, dopants and charge states. A common shortcoming of these techniques is that it is very difficult to ensure that the thermal contact between the sapphire and the heat sink is uniform over the entire sapphire surface. Non uniform contact results in a nonuniform temperature within the overlying silicon film 22 which creates an amorphous layer 22A which is not uniformly amorphous due to partial self-annealing. If the silicon film 22 is held at higher temperatures, the dose and/or energy must be increased to ensure amorphization of layer 22A. If the temperature of the silicon film 22 is maintained at too high a temperature or not controlled at all, the ion implantation will cause the substrate temperature to rise, thereby increasing the required dose and/or energy required to amorphize layer 22A to a level where aluminum will out diffuse from the sapphire 12 into the silicon 22. The present invention overcomes these shortcomings by cooling the sapphire with a flow of cooled gas and by adjusting the gas flow and/or temperature of the gas to ensure that the silicon layer 22 is maintained at or below a predetermined temperature. For the dose and energy cited above, the substrate 12 is cooled to a temperature that maintains the surface of the silicon film 22 at a temperature preferably lower than about 0° C. One configuration for accomplishing these objectives is illustrated in FIG. 1B.

In FIG. 1B, the SOS wafer 11 is positioned on a support structure 17 in a manner which creates a chamber 21 between the sapphire substrate 12 and the support structure 17, for example, by placing an O-ring 19 between the support structure 17 and the SOS wafer 11. Cooled gas is circulated through the chamber 21 to cool the substrate 12. Since the gas has the same thermal contact with all areas of the substrate 12, uniform cooling is assured. Gas enters the chamber 21 through an inlet 23 and exits the chamber through an outlet 25.

Figure 1C:
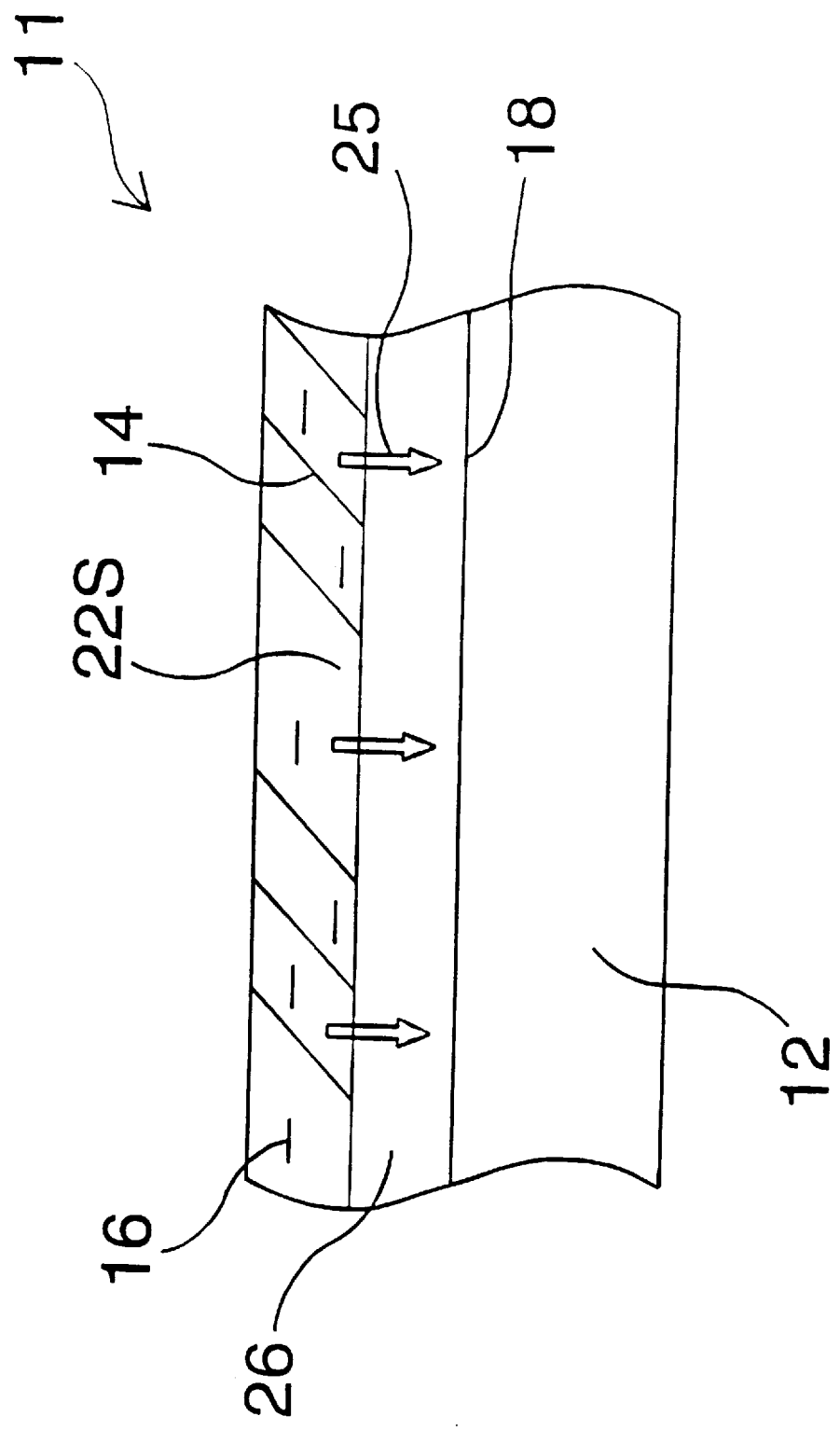

After creating the amorphous region 22A through silicon ion implantation, the SOS wafer 11 is subjected to a thermal anneal step at approximately 550° C. in an inert atmosphere (e.g., nitrogen) to induce solid phase epitaxial regrowth from the surface of the monocrystalline silicon region 22S downward through the amorphous region 22A to the interface 18. Thus the amorphous region 22A is regrown as a single crystal region 26. The direction of the regrowth from the monocrystalline silicon region 22S to the interface 18 is depicted by arrows 25 in FIG. 1C. Upon completion of this solid phase epitaxial regrowth, the anneal temperature is increased to approximately 900°–950° C. in an inert atmosphere (e.g., nitrogen) to remove any remaining defects or states, thereby converting the amorphous region 22A (FIG. 1B) into a substantially pure single crystal region 26 (FIG. 1C) devoid of the twins 14 and the bandgap states 16 (FIG. 1A).

Figure 1D:
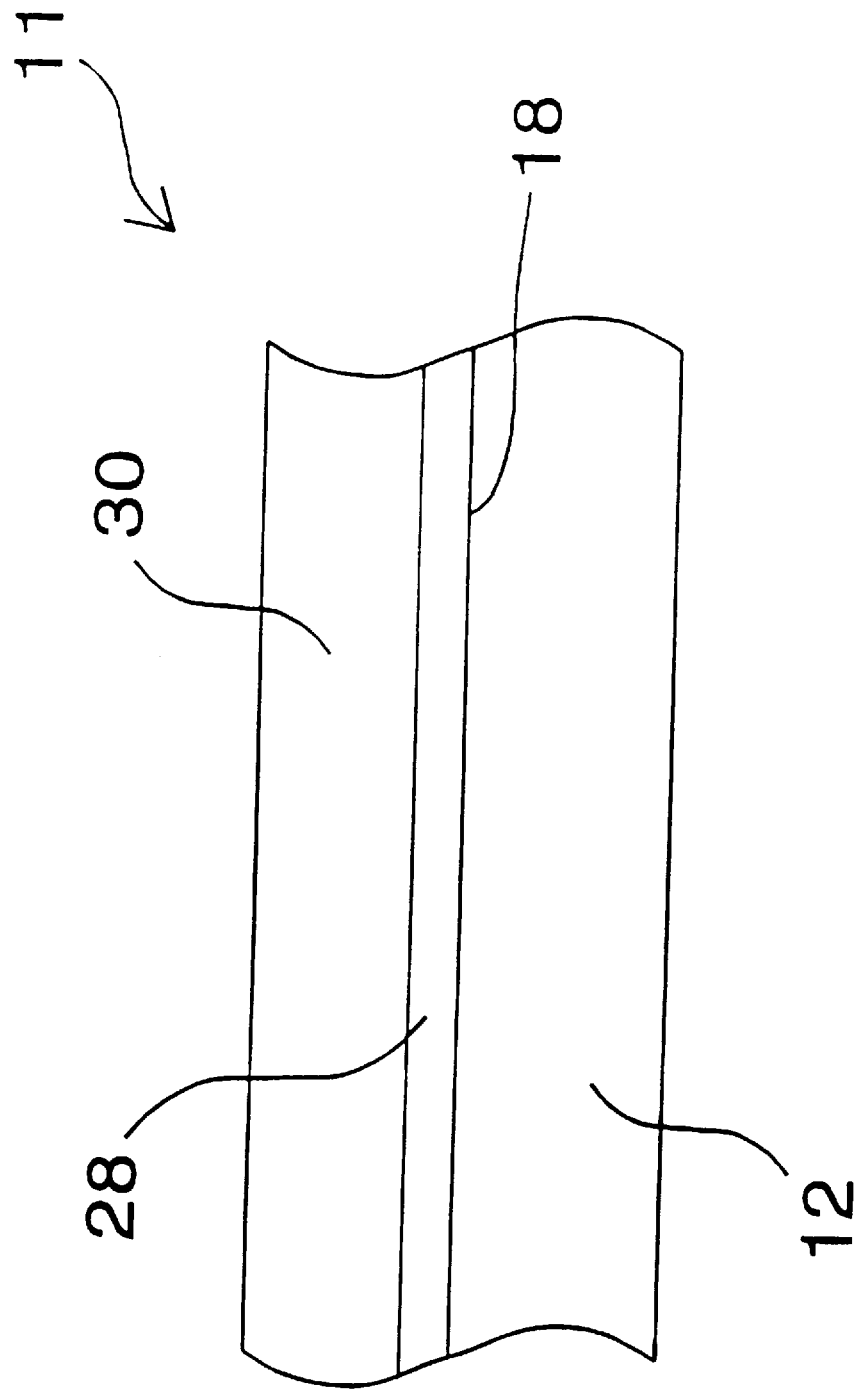

As shown in FIG. 1D, a silicon dioxide region 30 having a thickness of approximately 360 nm is then grown in the monocrystalline silicon region 22S by converting the ambient gas in the annealing system from nitrogen to an oxidizing ambient (e.g., steam or oxygen). The silicon dioxide region 30 is sufficiently thick to consume all the remaining twins 14 and band gap states 16 in the surface region 22S (FIG. 1C) of the silicon film 22. The silicon dioxide region 30 is sufficiently thick to leave an approximately 110 nm thick region of substantially pure silicon 28 (i.e., containing substantially zero defects and bandgap states) immediately adjacent the sapphire substrate 12.

Referring now to FIG. 1E, the silicon dioxide film 30 is removed (etched) to result in an approximately 110 nm thick substantially pure silicon film 28 on the sapphire substrate 12. Thus, referring to FIG. 1C, the twins 14 and the states 16 in the upper portion of the silicon film are removed by forming the silicon dioxide film 30 and etching it away. Removal of the silicon dioxide film 30 may be delayed if it could serve a masking or other purpose. The substantially pure silicon film 28 on the sapphire substrate 12 is now suited for MOSFET fabrication.

The above process of the present invention advantageously produces the substantially pure ultrathin silicon film 28 and reduces processing costs and complexity by using only one implant cycle and one anneal cycle.

Design and fabrication of fully depleted MOSFET's are described with reference to FIGS. 2 and 3. In all of the below-described embodiments, all of the MOSFET processing steps are preferably limited to temperatures less than approximately 950° C. in order to maintain the purity of the silicon in channel regions. Additionally, all anneals performed in non oxidizing conditions are performed at temperatures less than approximately 950° C.

In one MOSFET embodiment, formation of isolated N-type and P-type regions in the silicon layer 28 is accomplished using a process often referred to as "local oxidation of silicon" (LOCOS). Unless otherwise stated, it will be understood throughout that there may be other standard semiconductor processing steps which will achieve the same or functionally similar results as described below. Substitution of these alternatives are considered to be within the scope of the present invention as long as they do not result in a processing step performed in non oxidizing conditions that subject the silicon layer 28 or any subsequent regions fabricated in the silicon layer 28 to temperatures in excess of approximately 950° C. For example, instead of using the LOCOS process to form the isolated n-type and p-type regions, alternative isolation techniques may also be employed. One such alternative process etches the silicon layer 28 (FIG. 1E) into individual islands (sometimes called "mesas") to form the isolated n-type and p-type regions. Additional alternative processing procedures are disclosed in a book entitled "VLSI Technology," Second Edition, edited by S. M. Sze, published by McGraw-Hill, New York, 1988, incorporated herein by reference.

Figure 2A:
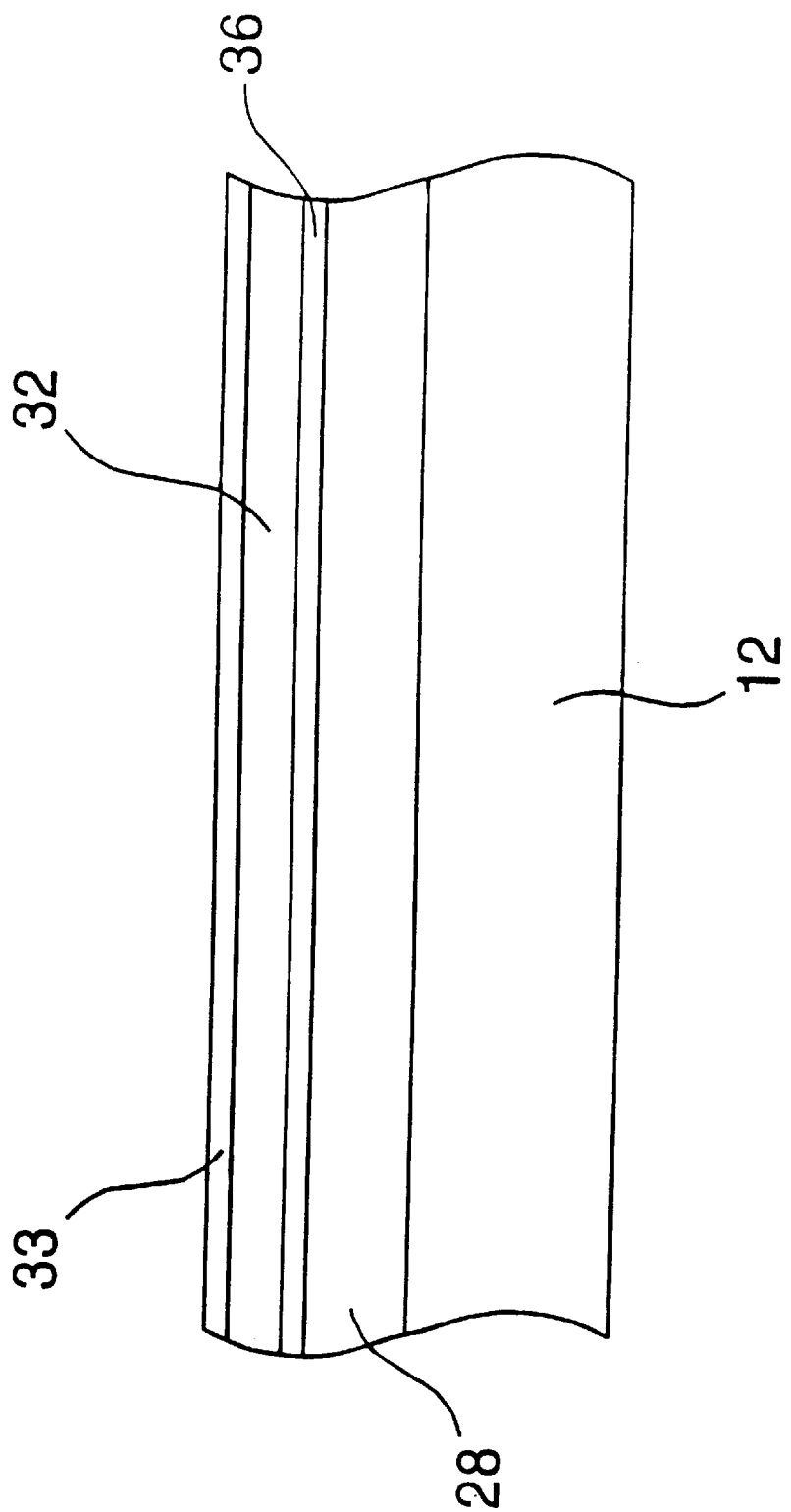
FIGS. 2A–2E illustrate a MOSFET and fabrication process steps used to manufacture the MOSFET in substantially pure silicon-on-sapphire material.
Figure 2B:
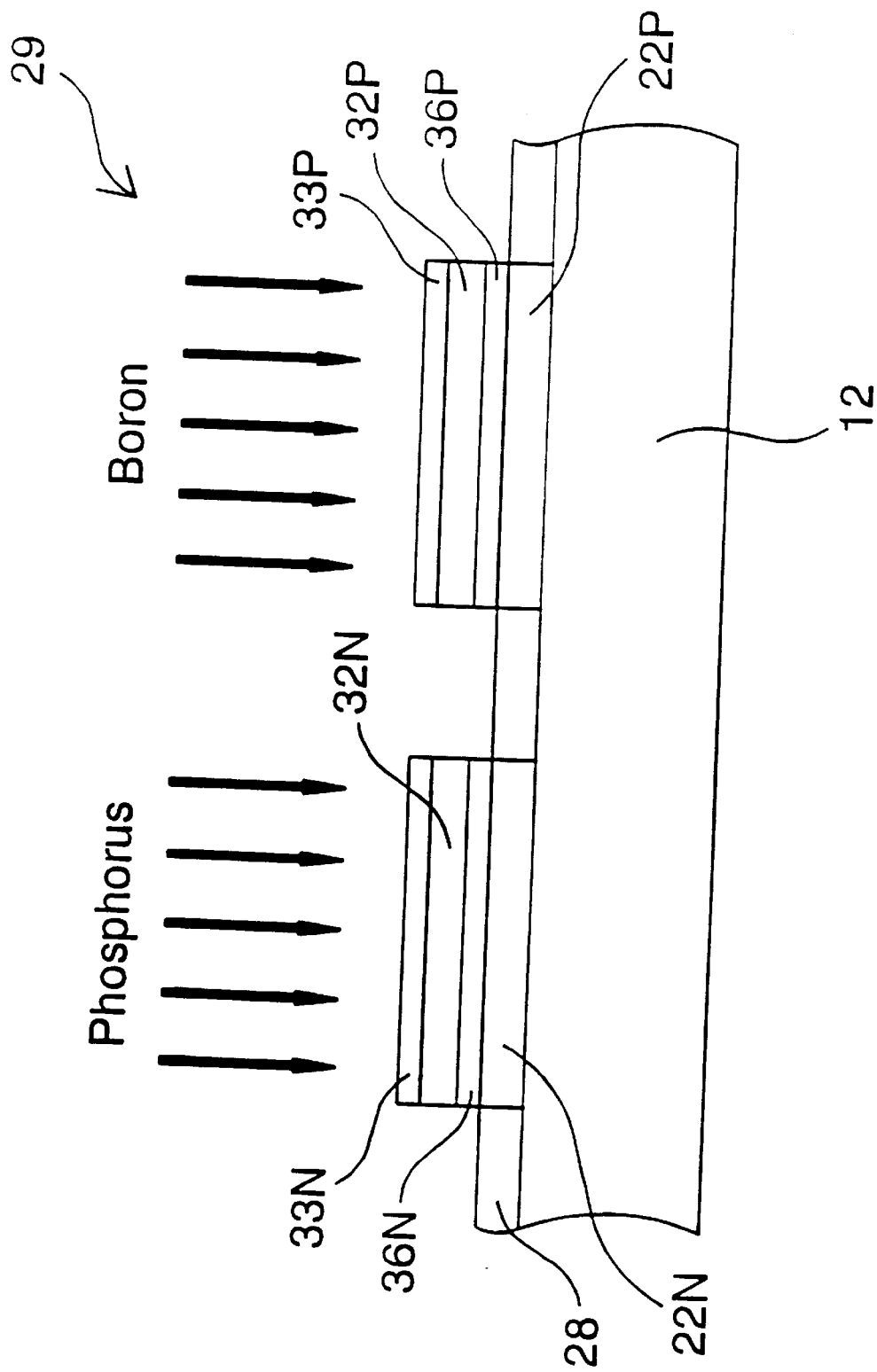
Figure 2C:
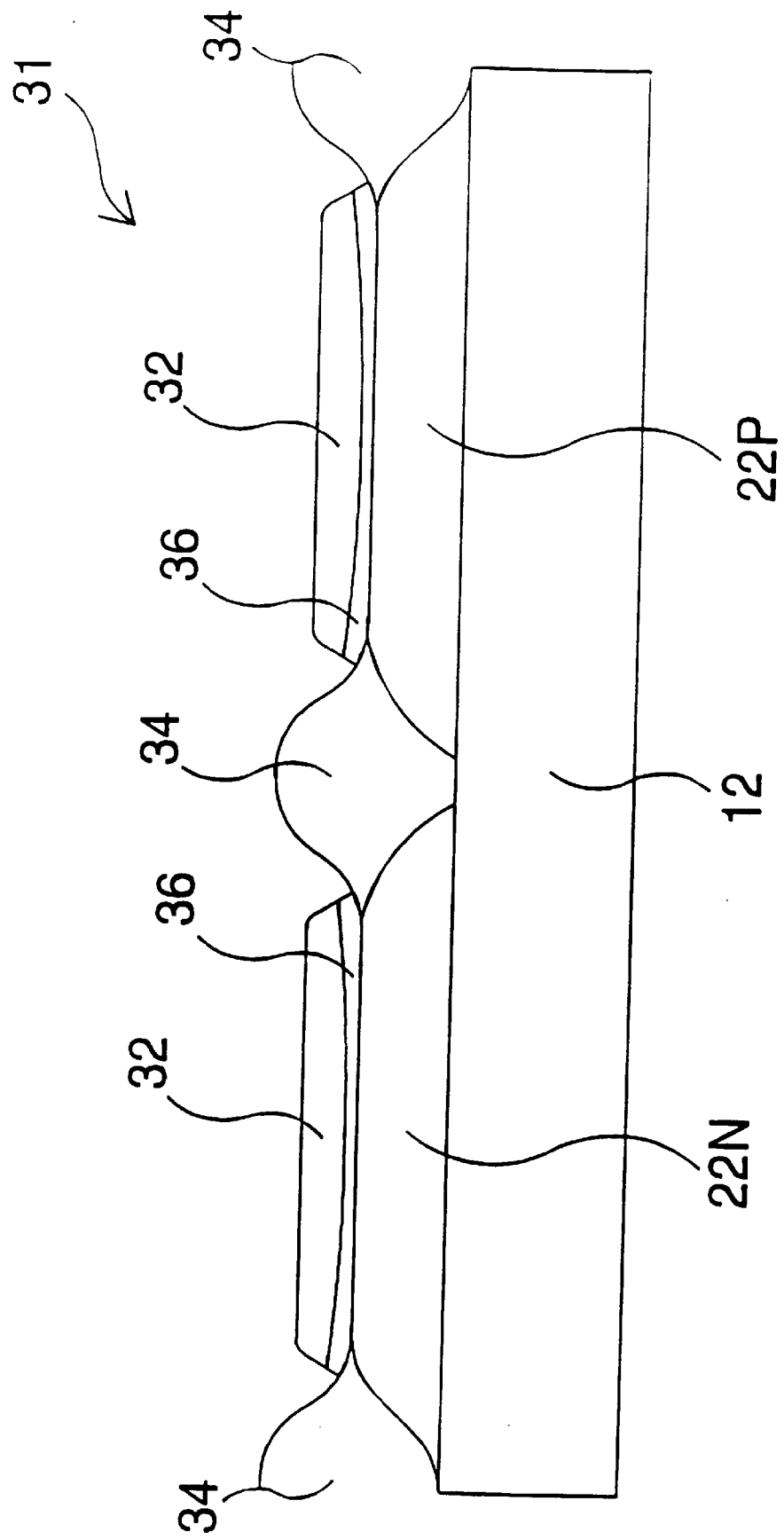

As shown in FIG. 2A, formation of isolated N-type and P-type regions with the LOCOS process begins with the deposition of a silicon dioxide layer 36, a silicon nitride layer 32 and a photo-resist layer 33 on top of the silicon layer 28 of the silicon-on-sapphire wafer 11 shown in FIG. 1E. Using standard masking and etching processes, individual islands (36p,32p,33p) and (36n,32n,33n) of the silicon dioxide layer 36, silicon nitride layer 32 and photo-resist layer 33 are formed on the surface of the silicon layer 28 as shown in FIG. 2B. Standard masking and ion implantation techniques are used to form a silicon N-type region 22N and a silicon P-type region 22P. For example, as shown in FIG. 2B, the silicon N-type region 22N is formed by ion implantation of the silicon layer 28 underlying the island (36n,32n, 33n) with phosphorus and the silicon P-type region 22P is formed by ion implantation of the silicon layer 28 underlying the island (36p,32p,33p) with phosphorus. As shown in FIG. 2C, the silicon N-type region 22N is isolated from the silicon P-type region 22P by the growth of a silicon dioxide region 34. The silicon dioxide regions 34 are grown by introducing the wafer 29 shown in FIG. 2B into a high temperature (less than approximately 950° C.) oxidizing ambient environment. The silicon dioxide isolation regions 34 extend down to the sapphire substrate 12. Although the wafer 29 is in an oxidizing ambient, the silicon nitride layer 32 shields the silicon regions 22N and 22P, thereby keeping those regions from oxidizing. After growing the isolation regions 34, the silicon nitride layer 32 and the stress relief oxide layer 36 are stripped away.

FIG. 2C shows regions 22N and 22P fully isolated from each other by the silicon dioxide isolation regions 34 for complementary MOS transistors. Alternative isolation techniques may also be employed. For example, the silicon layer 28 (FIG. 1E) may be etched into individual island. Thus, upon removal of the silicon dioxide regions 34 by etching, the silicon islands 22N and 22P become individual isolated islands or mesas.

Figure 2D:
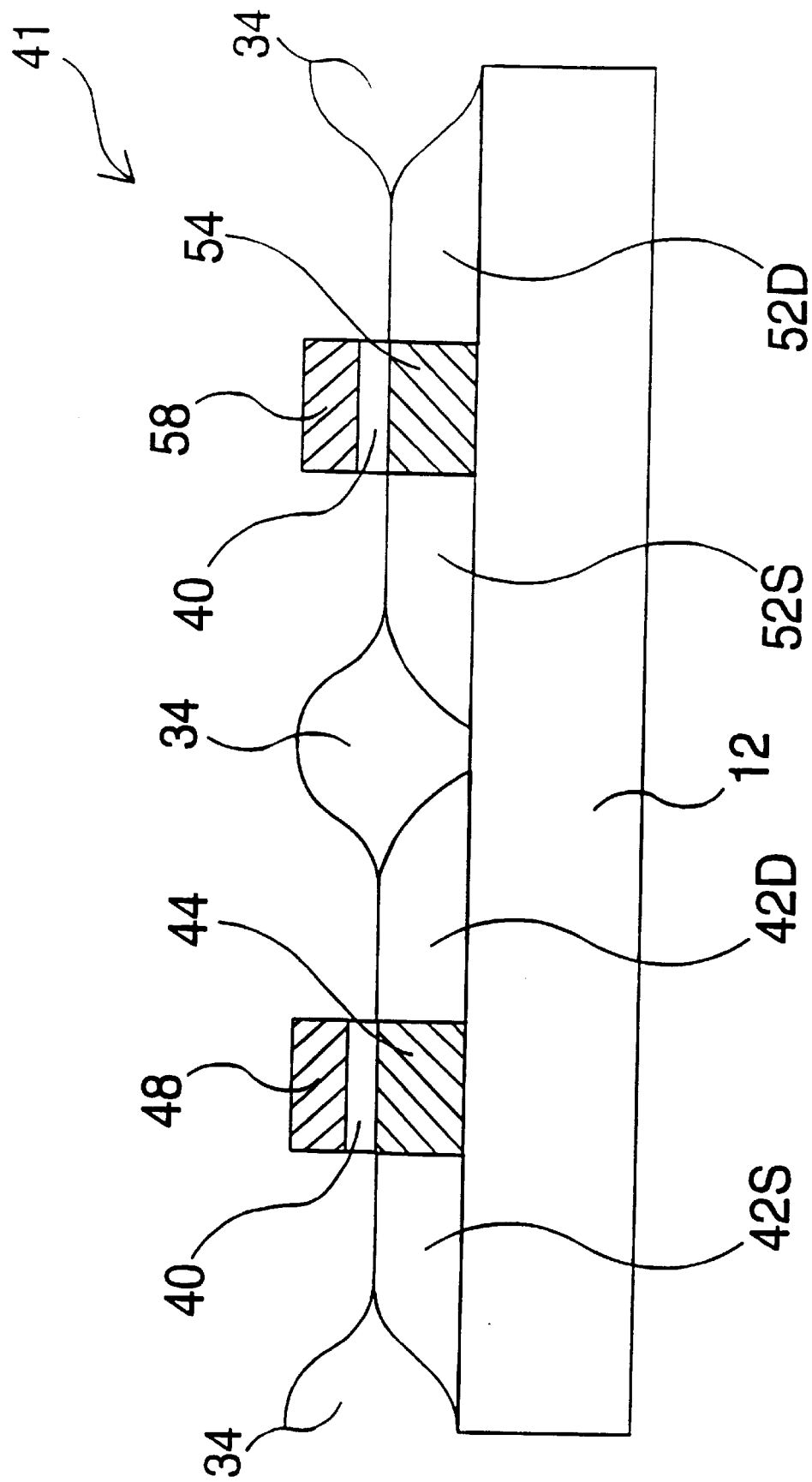

A subsequent stage 41 of the MOSFET process is shown in FIG. 2D. In stage 41, the N-type and P-type regions 22N and 22P (FIG. 2C) are further processed to form self-aligned sources 42S and 52S, conduction regions 44 and 54, and self-aligned drains 42D and 52D, respectively. Additionally, gate insulators 40 and gate conductive layers 48 and 58 form a control gate structure. The control gate structure is formed by thermal oxidation of the gate insulators 40 followed by deposition and patterning of a chosen gate conductive layer 48 for the P-channel and 58 for the N-channel. For electrostatic reasons, it is preferred that the gate length, i.e., the distance separating the source 52S from the drain 52D, be maintained at more than about 5–10 times the thickness of the conduction region. For example, a 500 nm gate length should be made in a silicon film thinner than about 100 nm, and preferably closer to 50 nm.

Referring to FIG. 2D, self-aligned sources and drains 42S, 42D, 52S and 52D are formed by ion implantation or diffusion. Doping the source and drain regions of thin silicon films is subject to certain limitations. For example, ion implantation doping can amorphize the entire thickness of the source/drain region. An amorphized film will not properly recrystallize from the sapphire substrate and high resistivity may result. Therefore, it is preferable that the source and drain regions be formed by diffusion doping since the sapphire substrate forms a diffusion barrier to the dopant atoms. Diffusion doping of the source/drain regions represents an improvement over conventional MOSFET designs using implantation doping in that very thin (i.e., shallow) source/drain regions 42S, 42D, 52S and 52D having low resistivities can be fabricated by means of a single diffusion step.

Since the sapphire substrate 12 is an effective diffusion barrier and since the depth of the source and drain regions 42S, 42D, 52S and 52D are determined by the thickness of the silicon film, forming shallow source and drain regions is controlled by the structure, not by diffusion time and temperature, as in conventional transistor processing. Therefore diffusion doping can be used for scaled-down dimensions. Diffusion doping has several advantages over ion implantation including: the host silicon is not damaged or transformed into amorphous regions; the process is inherently scalable to the thinnest silicon films; and higher doping concentrations can be achieved.

Threshold voltage of the control gate structure is initially determined by correctly choosing the gate conductor material according to its "metal work function." If necessary, further adjustments to the threshold voltage are made by introducing appropriate dopant atoms into the conduction channel, for example, by ion implantation into the conduction regions 44 and 54. In accordance with the present invention, no dopant atoms other than those introduced for threshold adjustment (or to ensure surface channel conduction, see below) are present in the conduction channel regions 44 and 54. The absence or low concentrations of dopants in the MOSFET embodiments of the present invention represent an improvement over traditional MOSFET designs wherein substantial concentrations of dopant atoms are typically present for various reasons (e.g., as integral parts of traditional transistors to provide isolation, as a byproduct of counter doping, etc.). By fabricating MOSFETs in substantially pure silicon-on-sapphire in accordance with the present invention, only minimal concentrations of dopant atoms (if any) are present, thereby eliminating parasitic charge and its associated degradations discussed above.

Gate conductor layers 48 and 58 are often multilayer structures. In this case, the threshold voltage is determined by the characteristics of the primary gate conductor layer, i.e., the layer which is immediately adjacent the gate insulator 40. Conductive layers above the primary gate conductor layer are included for various reasons, especially to reduce series resistance (See FIG. 3 and discussion below for an example). However, such secondary gate conductive layers do not affect the threshold voltage of transistors. Each of the gate materials cited below has various applications when the material is in contact with the gate insulator 40.

$P^+$ and $N^+$ polysilicon gate materials, used in various combinations in N-type MOSFETS and P-type MOSFETS, are useful in designing and fabricating digital and analog circuits, voltage reference circuits and memory type circuits. $P^+$ polygermanium is a good choice for high performance digital logic where symmetric threshold voltages for N- and P-type MOSFETs are desired. Any conductive material which has a metal work function at the center of silicon's band gap (i.e., equal to silicon's electron affinity plus half the band gap or more specifically, a metal work function of 4.5–4.7 eV) results in symmetric threshold voltages for N- and P-channel MOSFETs. Examples of such materials are tungsten, chrome, indium tin oxide, and titanium nitride, among others. The material may be different or the same for each transistor type (regions 48 and 58) depending on the desired threshold voltage. Examples of choice of material and resultant threshold voltages are approximately as follows:

$N^+$ polysilicon gate conductor results in $V_{tn}=0$ V and $V_{tp}=-1$ V;

$P^+$ polysilicon gate conductor results in $V_{tn}=+1$ V and $V_{tp}=0$ V;

$P^+$ polygermanium, tungsten, indium tin oxide or titanium nitride gate conductors result in $V_{tn}=+\frac{1}{2}$ V and $V_{tp}=-\frac{1}{2}$ V;

where $V_{tn}$ and $V_{tp}$ are the threshold voltages of N- and P-channel MOSFETs, respectively.

As can be seen from the above discussion and referring to FIG. 2D, if a threshold voltages of +1 Volt for the N-channel and −1 Volt for the p-channel were desired, region 48 could be $P^+$ polysilicon and region 58 could be N+ polysilicon (i.e., different materials). If threshold voltages of +½ Volt for the N-channel and −½ Volt for the P-channel were desired, regions 48 and 58 could be P+ polygermanium, tungsten, indium tin oxide or titanium nitride (i.e., the same material). Numerous other material choices, and therefore other choices of threshold voltages, are also available.

The gate dielectric material 40 is grown and the gate conducting materials 48 and 58 are deposited using process conditions which avoid introduction of states or fixed charges into the channel regions 44 and 54. Specifically, processing temperatures and ambients are chosen to avoid generation of interface states or fixed charge in the dielectric. Therefore, as previously discussed, processing temperatures should be kept below approximately 950° C. Also, for P+ doped conductors as gate material 48 or 58, processing temperatures, times and ambients should be chosen to avoid diffusion of the dopant atoms from the gate conductors 48 and 58 through the gate dielectric insulator 40 into the silicon films 44 and 54. Diffusion barriers such as silicon nitride as part of the gate dielectric insulator 40 can be used to prevent such dopant migration.

Use of metal work function exclusively (i.e., no dopant atoms introduced into the conduction region) to set threshold voltage has the desirable effect of accurate and predictable threshold voltage control which is independent of process variations or certain device parameters.

Surface channel transistor behavior occurs when conduction occurs in the silicon channels 44 and 54 at the interface between the gate insulator 40 and the silicon films 44 and 54. In some designs, it may be desirable to intentionally induce surface channel conduction. This may be accomplished by implanting very small amounts of dopant atoms into the substantially pure silicon channel regions 44 and 54. This will result in surface channel conduction without significantly affecting the threshold voltage. Such a device is defined herein as an "intrinsic surface channel MOSFET." Additional dopant atoms, such as boron, phosphorous or arsenic, may be introduced into the channel regions 44 and 54 to further adjust the threshold voltage of the intrinsic surface channel MOSFET. Addition of dopant atoms in excess of that necessary to adjust the threshold voltage may introduce some of the adverse effects cited earlier, such as impurity scattering and possible threshold voltage variation. However, a device constructed in accordance with this invention contains only the dopant atoms necessary to induce surface channel conduction and to set threshold voltage. Therefore, none of the other parasitic charges found in traditional MOSFETs are present. The present invention thereby minimizes the dopant charge in regions 44 and 54 and adverse effects associated with higher concentrations of dopant charge.

A maximum amount of dopant charge can be introduced into channel regions 44 and 54. If the maximum amount is exceeded, the depletion region will not reach the sapphire 12, thus eliminating fully depleted operation. The maximum dopant charge is dependent on the silicon film thickness in the channel regions 44 and 54. For the preferred embodiment, the regions 44 and 54 are approximately 100 nm thick and the maximum dopant density is approximately $1 \times 10^2 cm^2$.

Figure 2E:
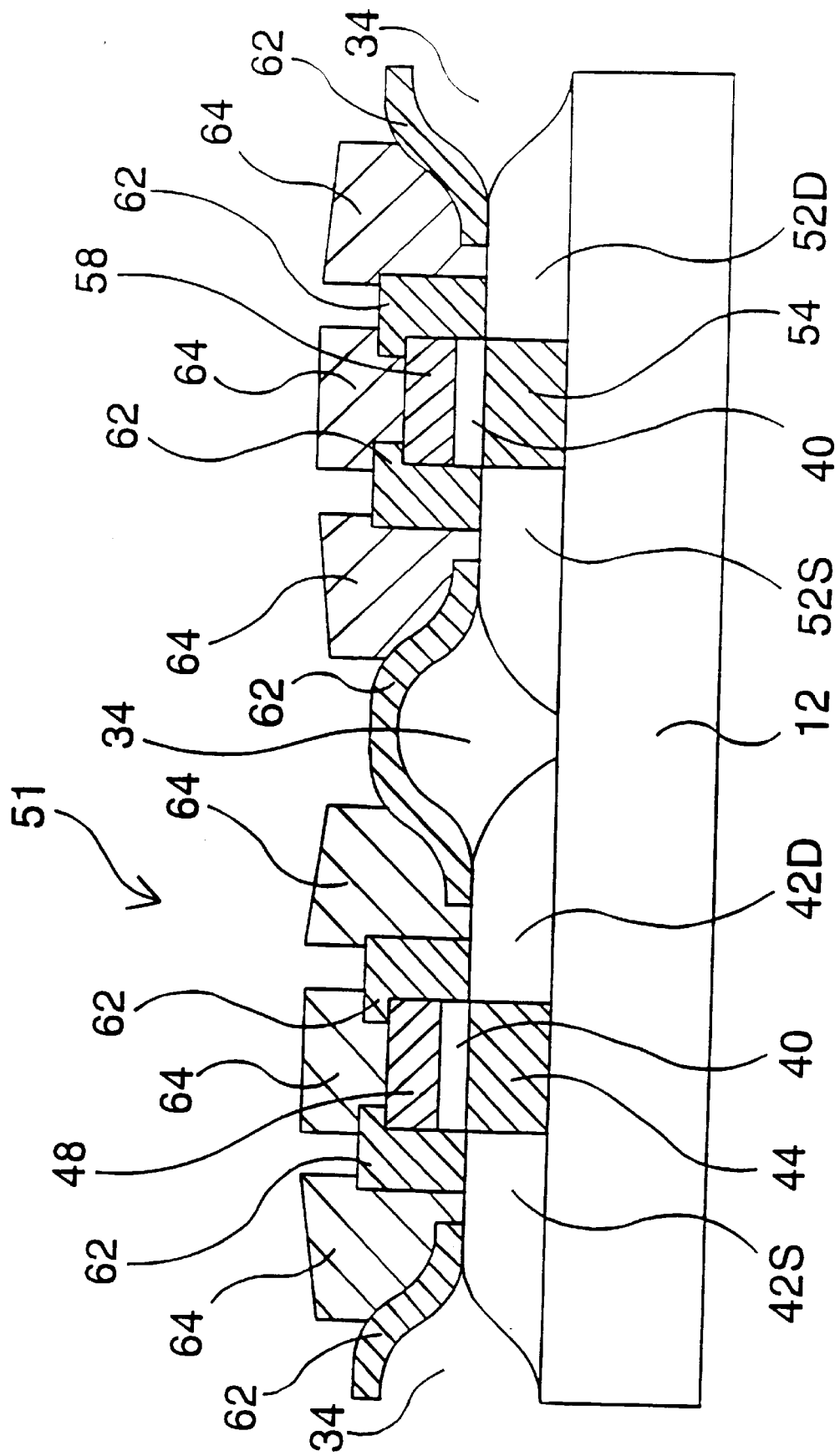

A next stage 51 of the MOSFET fabrication process is shown in FIG. 2E. In this stage, insulating layer 62 and metal layer 64 are deposited and patterned for interconnecting devices as desired. Specifically, an interlevel insulating layer 62 is deposited and patterned, followed by deposition and patterning of a metallic conductor interconnecting layer 64. Additional layers of insulators and metallic conductors may be added as needed (not shown). Another advantage of the present invention is apparent at this point, there are no opportunities for metal to diffuse into the source and drain regions as in many conventional MOSFET fabrication processes. In the present invention, after deposition and patterning of the metallic interconnect layer 64, an annealing step is performed. This annealing step serves two primary functions: to remove states and charge which may have been introduced during the previous processing steps and to sinter different metallic layers to form low resistance contacts. In conventional processing, source and drain junctions are deep enough to ensure that no metal will diffuse through them and into an underlying silicon substrate, thereby destroying transistors. In the current invention, such a failure mechanism does not exist since only sapphire 12 is found beneath the source and drain regions 42S, 42D, 52S and 52D.

Figure 3A:
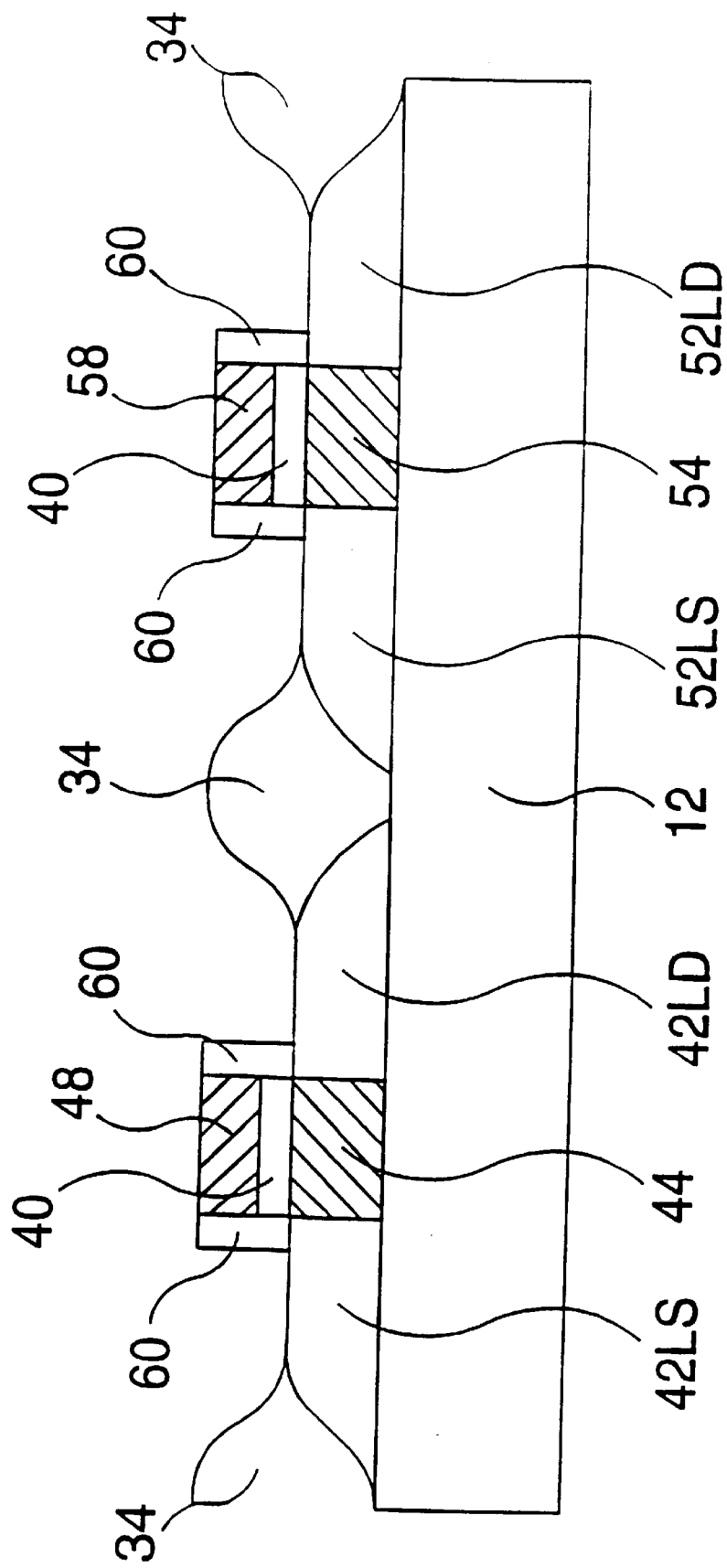
FIGS. 3A–3C illustrate a process for adding sidewall spacers, lightly doped drains and self-aligned silicide to the device of FIGS. 2A–E.
Figure 3B:
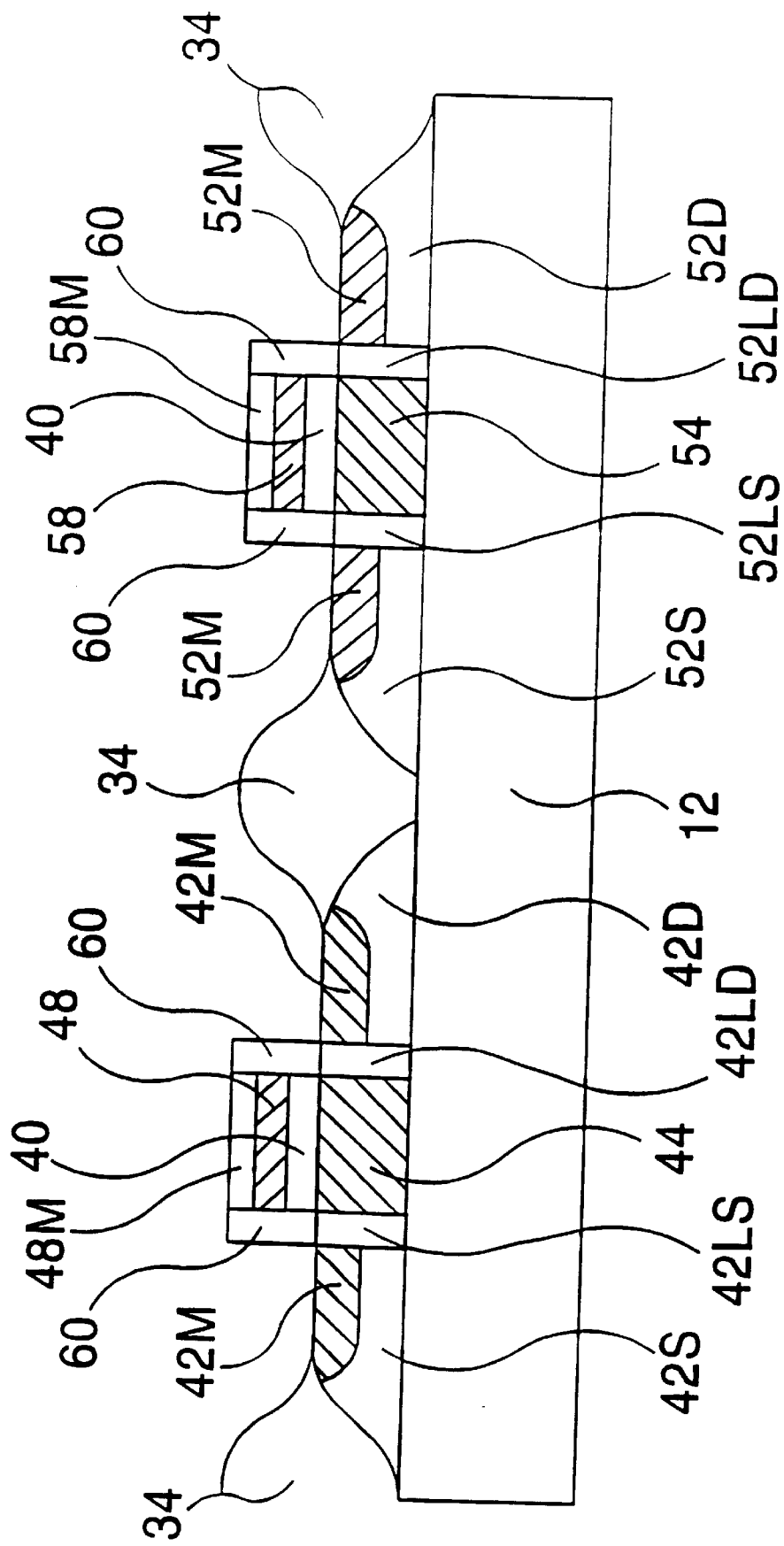
Figure 3C:
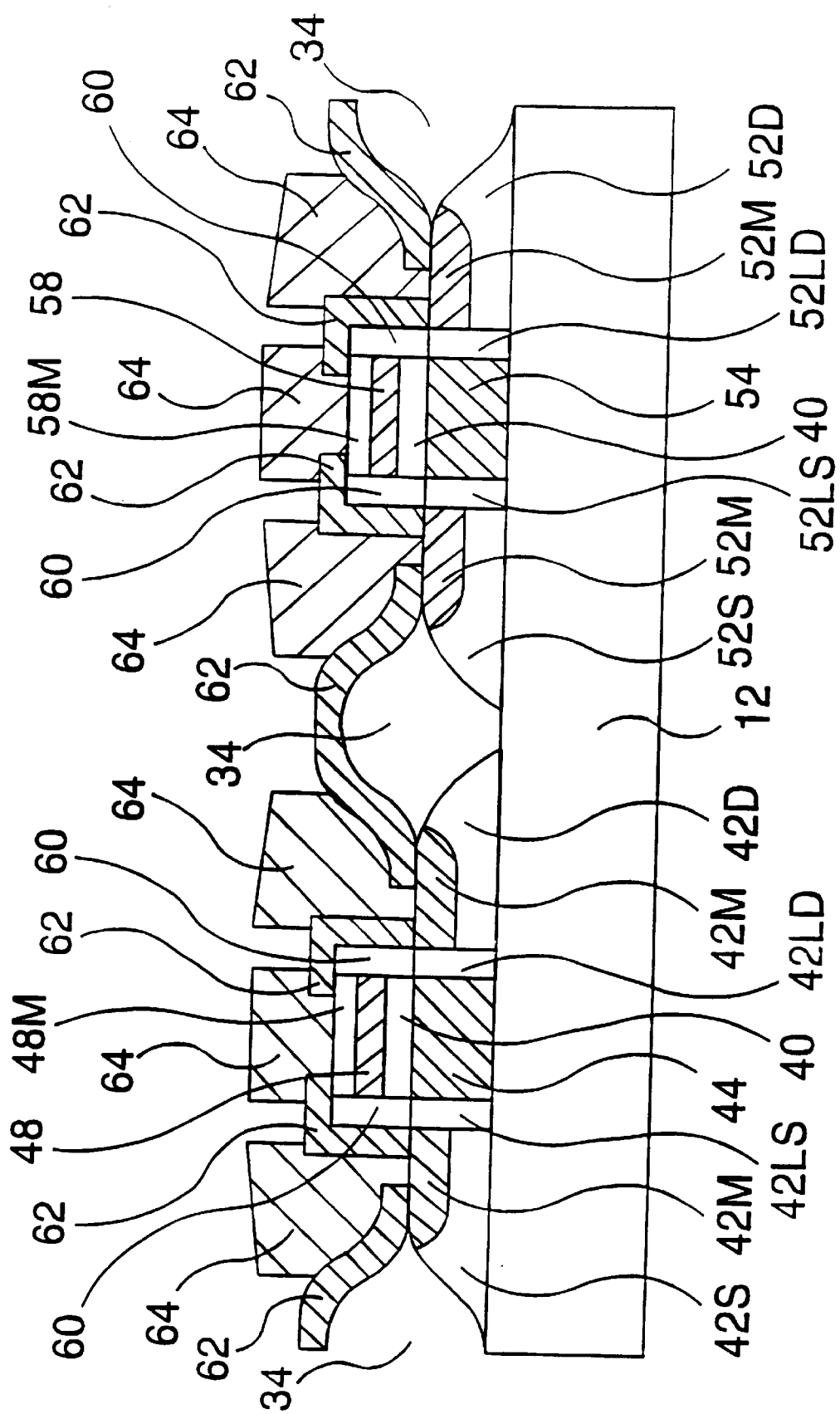

A lightly doped drain (LDD) structure or self-aligned silicide (salicide) embodiment is illustrated in FIGS. 3A, 3B and 3C. This embodiment may be implemented after the gate conductors 48 and 58 are patterned as discussed above and shown in FIG. 2D. Referring to FIG. 3A, after patterning the gate conductors 48 and 58, self-aligned lightly doped drain (LDD) regions 42LD and 52LD are formed by ion implantation or diffusion. The LDD reduces electric fields, thereby improving reliability and certain device characteristics such as drain breakdown voltage. However, the LDD also increases series resistance at both the drain and source, thereby decreasing output current. A trade-off is therefore inherent in the choice of an LDD and different requirements will lead to different LDD designs. The advantages cited above for diffusion doping of the self-aligned sources and drains 42S, 42D, 52S and 52D also apply to doping the LDD structures.

In the self-aligned silicide (salicide) embodiment of the present invention, a sidewall spacer 60 is deposited and etched adjacent to the gate structure comprising the gate insulator 40 and conductor 48, 58. Referring to FIG. 3B, final self-aligned sources and drains 42S, 42D, 52S and 52D are formed by ion implantation or diffusion. For appropriate gate conductors 48 and 58 (such as polysilicon or polygermanium) the structure is coated with a metallic material and reacted to form metallic compounds 48M and 58M in the upper portion of gate conductors 48 and 58 as well 42M and 52M in source and drain regions 42S, 42D, 52S and 52D. Stripping unreacted metal from sidewall spacers 60 completes the salicide (or germanide) processing. Referring to FIG. 3B, silicide regions 42M, 52M, 48M, and 58M are separated from each other by the sidewall spacers 60. The thickness of metallic regions 42M, 48M, 52M and 58M is controlled by the amount of metallic material which is deposited. Obviously, the salicide option exists independently of LDD doping level. Referring to FIG. 3C, a complementary MOS structure is shown with both LDD and salicide options included after metallization as described above for FIG. 2. Many other materials and processing options can be used in addition to or in replacement of those described above. It is to be understood that such choices may be practiced within the scope of this invention.

Figure 4A:
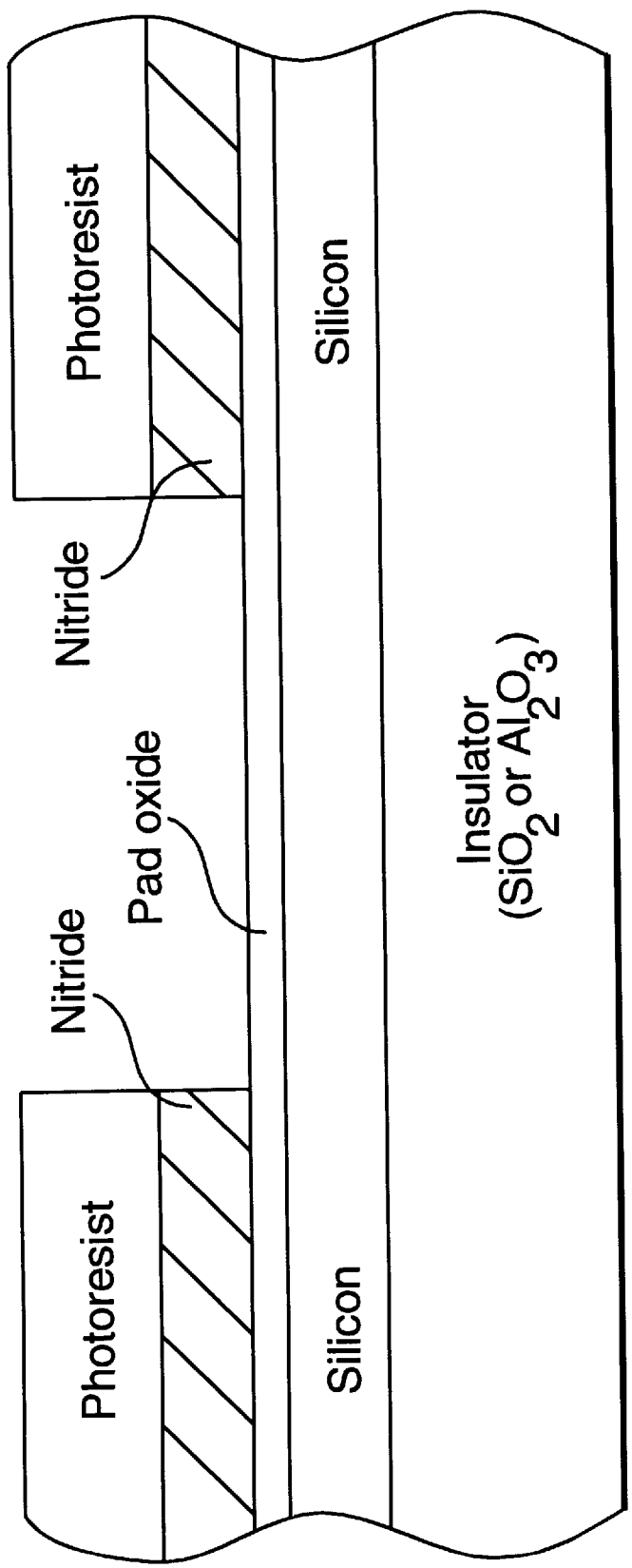
FIGS. 4A–4C show a typical SOI LOCOS process flow.
Figure 4B:
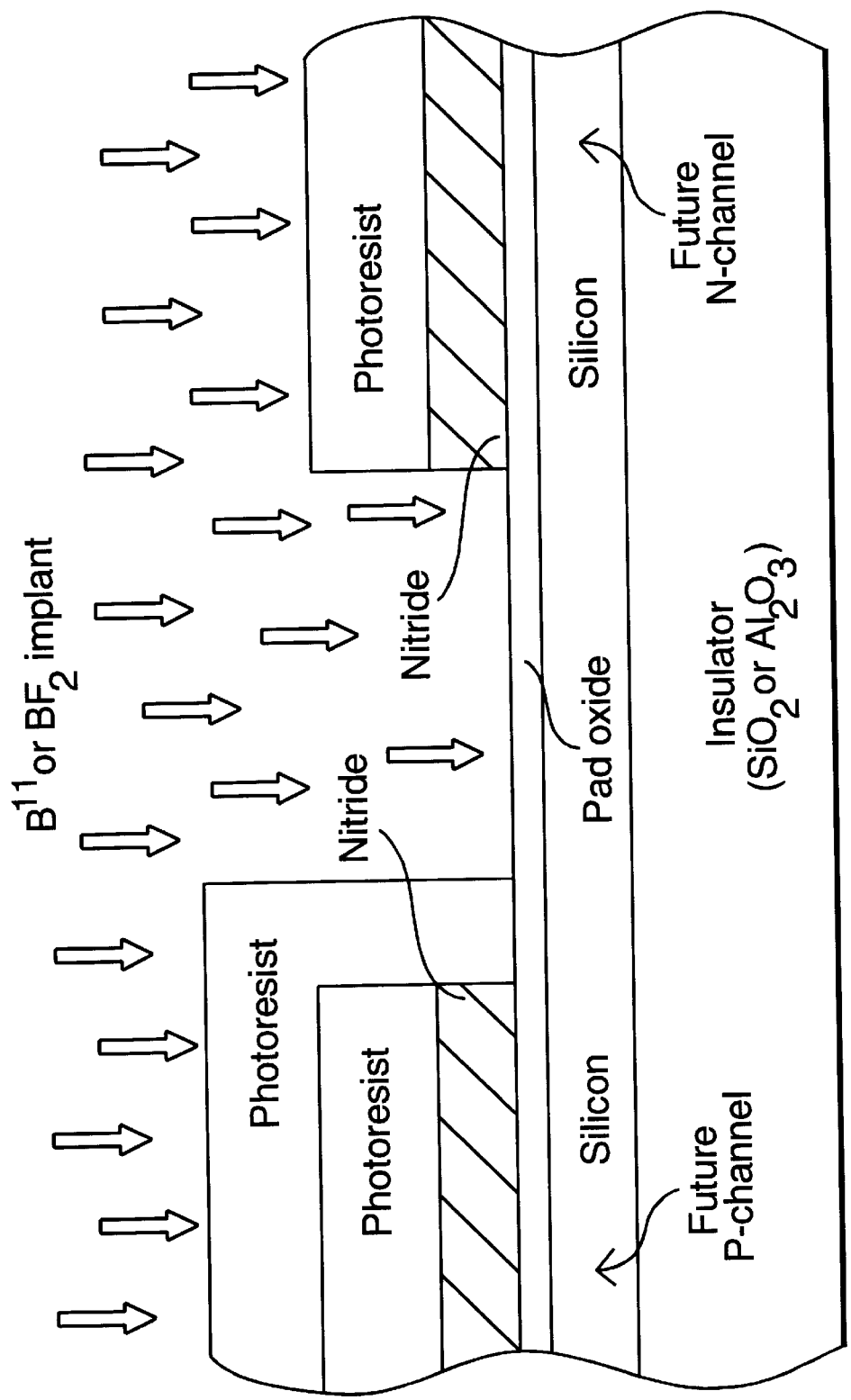
Figure 4C:
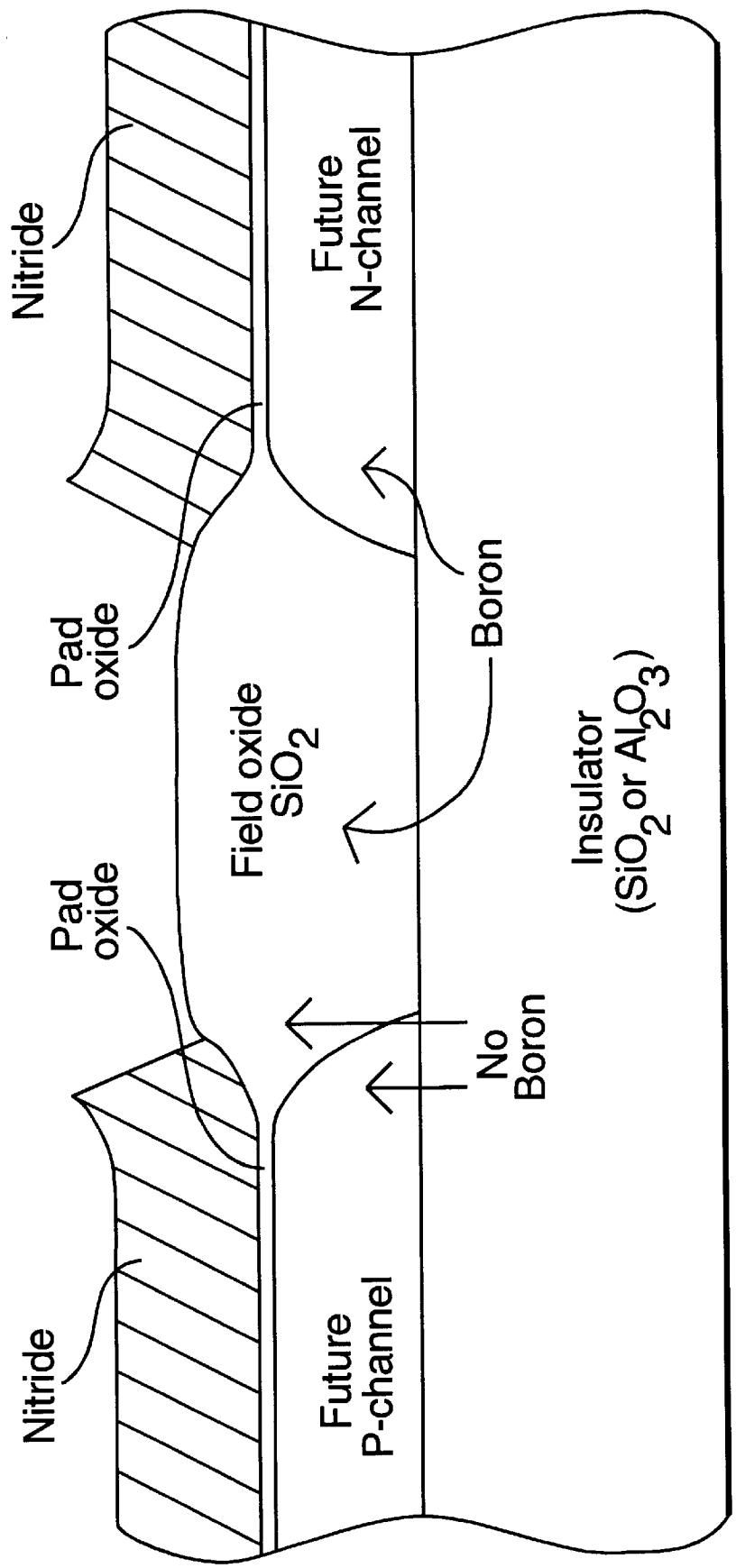

The present invention will be better understood with reference to the conventional method of SOI LOCOS isolation as shown in FIGS. 4A–4C. Referring to FIG. 4A, a layer of approximately 1,100 Å of silicon is provided over an insulator as shown. A pad oxide is grown over the silicon layer to a typical thickness of approximately 100–150 Å. A nitride layer having a typical thickness of approximately 1,000–2,000 Å is then provided over the pad oxide. A layer of photoresist is then provided over the nitride layer in accordance with conventional lithography techniques which are well known. The photoresist layer is then developed and the nitride is etched through to the pad oxide.

Referring now to FIG. 4B, the steps following the nitride etch shown in FIG. 4A for conventional SOI LOCOS processing will now be described. In FIG. 4B, a UV (ultraviolet) radiation source is used to harden the first photoresist layer. Then, a second photoresist layer is provided over the first photoresist layer and patterned appropriately. Boron or other desired conductivity determining material is then implanted by well known CVD ion implantation or other techniques through the pad oxide and into the silicon as shown. The second photoresist layer, which is now the top most layer, blocks the $B^{11}$ or $BF_2$ implant over the regions that do not require boron implantation. The first photoresist layer (the layer on top of the nitride) blocks the $B^{11}$ or $BF_2$ implant over the N-channel side.

FIG. 4C illustrates the final steps in conventional SOI LOCOS processing after the $B^{11}$ or $BF_2$ implant as shown in FIG. 4B. All of the photoresist layers over the silicon layer have been moved by techniques which are well known as illustrated in FIG. 4C. A field oxide ($SiO_2$) layer of approximately 2,500 Å is then grown by means of conventional oxidation methods in the region not covered by nitride. It is at this step that undesirable boron diffusion occurs beneath the nitride layer and beyond the edge of the future N-channel region, which will be described further in FIG. 6. Nitride is then removed in accordance with techniques which are well known.

Figure 5A:
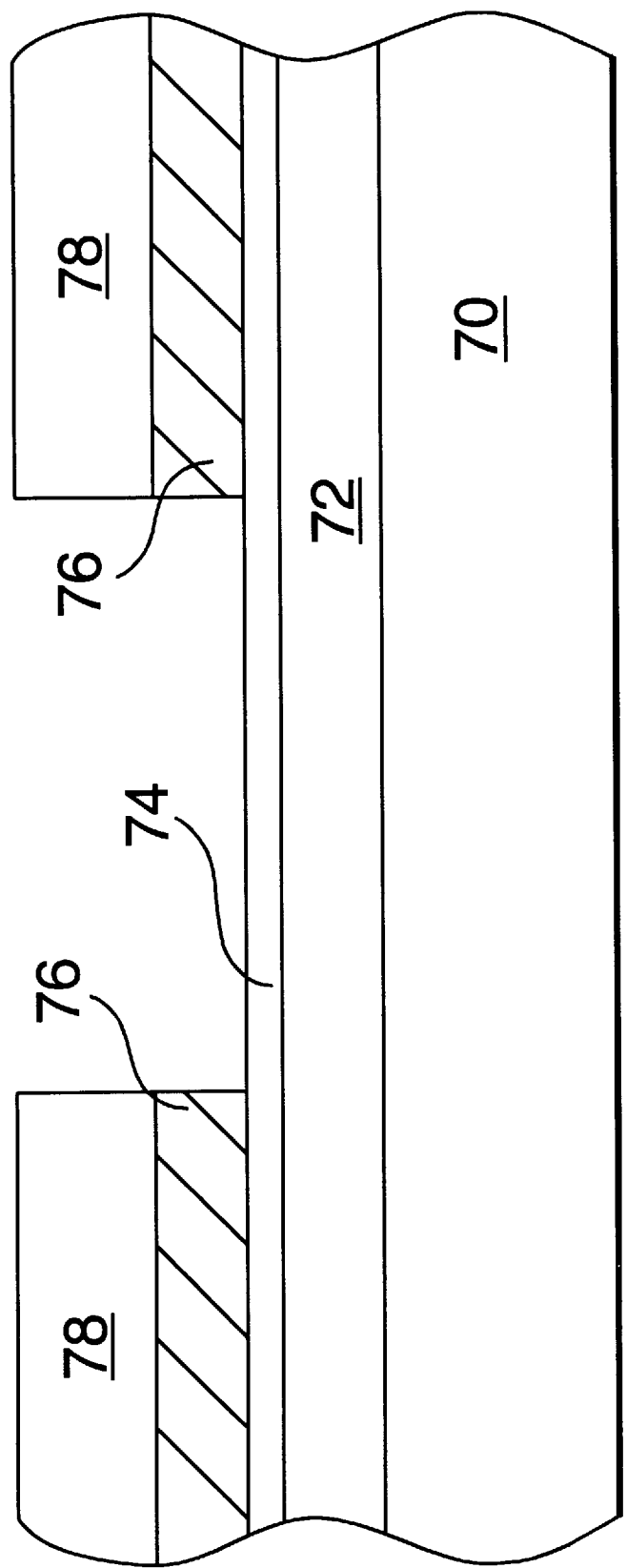
FIGS. 5A–5C show the LOCOS process flow for ultrathin silicon on sapphire or other SOI technology in accordance with the present invention.
Figure 5B:
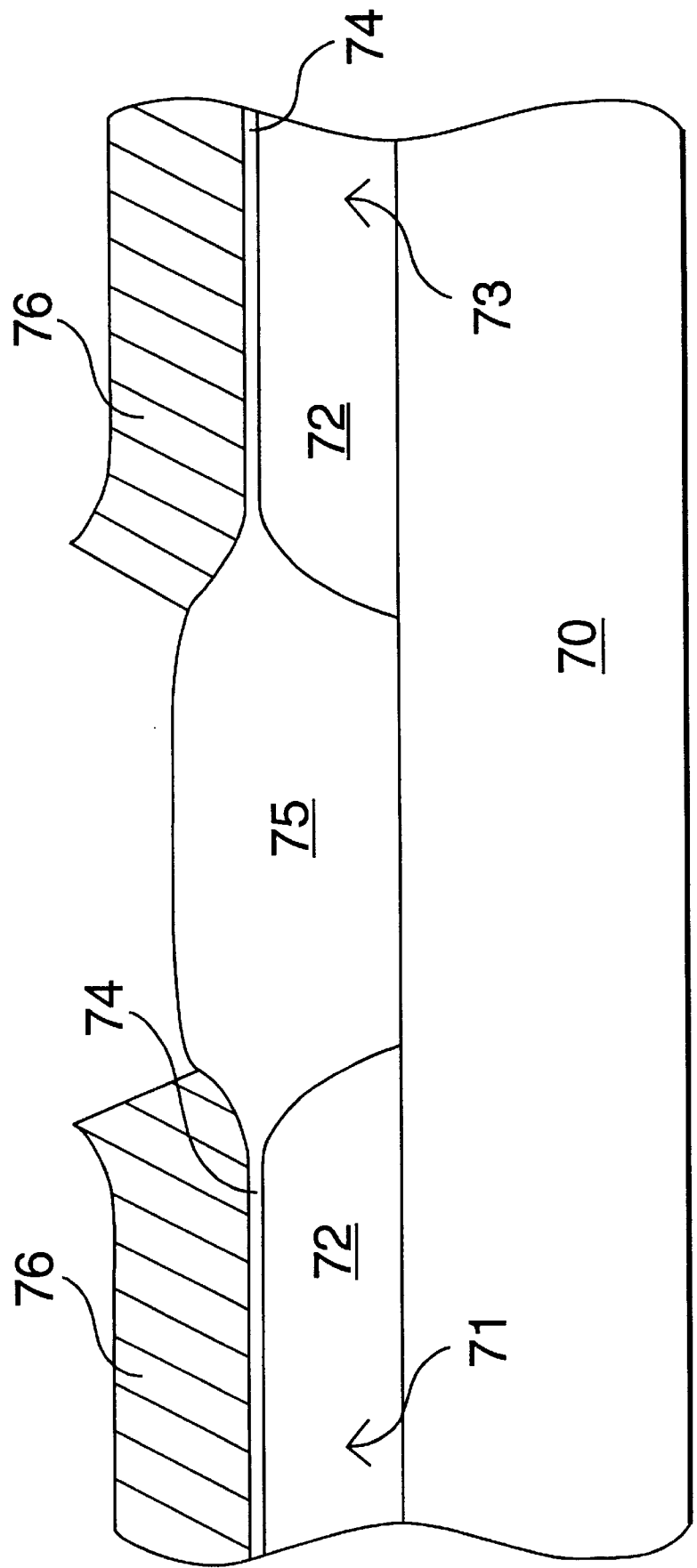
Figure 5C:
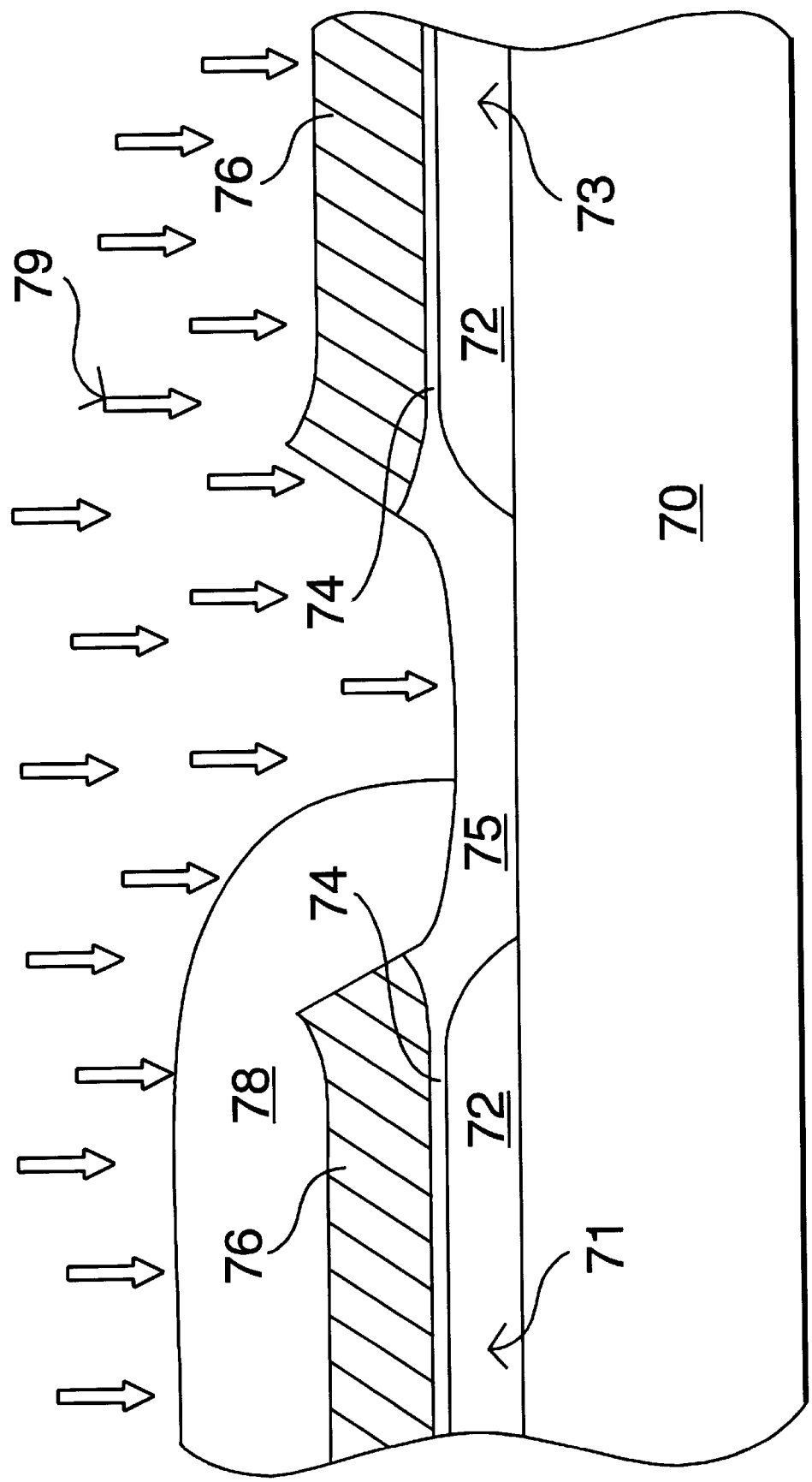

FIGS. 5A–5C show an alternate isolation process for making a corresponding device in ultrathin silicon on sapphire or other SOI technology in accordance with the present invention.

Referring to FIG. 5A, a thin layer of silicon 72 of approximately 1,500 Å or less is provided over an insulating substrate 70, comprising of $SiO_2$ or $Al_2O_3$, is shown. A pad oxide layer 74 is thermally grown to a thickness of approximately 100–150 Å. Next, a layer of silicon nitride $Si_3N_4$ 76 of approximately 750–2,000 Å is deposited over the pad oxide layer 74 by techniques previously described. A photoresist layer 78 is then provided over the nitride layer 76 to define regions in which transistors will be built. The photoresist layer 78 is then exposed and developed, and the nitride layer 76 is then removed by conventional etching techniques. The photoresist layers are then also removed. Oxidation is then applied to the structure in temperatures typically ranging from approximately 900° C.–1,000° C. for approximately 45–100 minutes.

FIG. 5B illustrates the structure after oxidation and removal of the photoresist layers 78 for the above LOCOS isolation process according to the present invention. Region 75 illustrates a field oxide $SiO_2$ layer due to the oxidation step.

FIG. 5C illustrates the final processing steps provided to the structure of FIGS. 5A and 5B, in accordance with the present invention. In FIG. 5C, the center portion of field oxide layer 75 has been partially etched by conventional dry or wet etching techniques, such as a reactive ion etch to a depth of approximately 1,000–1,500 Å. A second photoresist layer 78 is then selectively provided over a portion of the field oxide 75 and nitride layer 76. The second layer of photoresist 78 is then patterned in accordance with photolithographic techniques which are well known. The purpose of the second layer of photoresist 78 is to block the boron implant from selected regions in the silicon layer 72, such as, for example, the future P-channel region 71. Implantation of boron illustrated by arrows 79 occurs after the oxidation step and partial etch in accordance with the present invention. The boron ($B^{11}$ or $BF_2$) implant energy is a range of 35–65 kilo electron volts (keV). The device shown in FIG. 5C is completed by removing the photoresist layer 78 and subsequently removing nitride layer 76 in accordance with conventional techniques.

Figure 6:
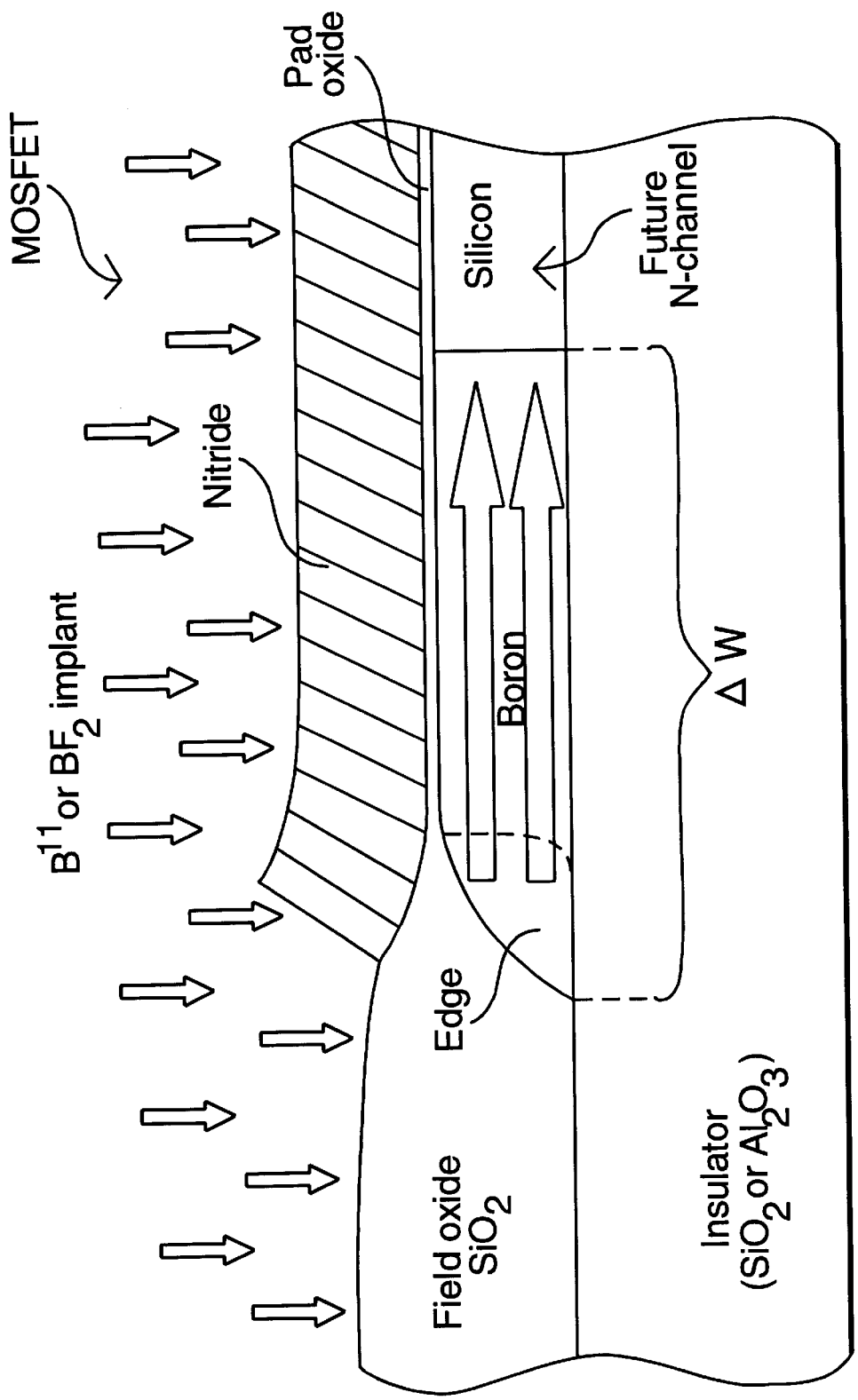
FIG. 6 shows a cross-sectional view of an N-channel MOSFET fabricated by the SOI LOCOS process of FIGS. 4A–4C, illustrating large ΔW characteristics.

The structure in FIG. 6 is the same cross sectional view of the structure shown in FIG. 4C, but is now showing only the NMOS side of the device. All the same elements and thicknesses described in FIGS. 4A–4C used for conventional SOI LOCOS processing applies to the structure in FIG. 6.

The MOSFET in FIG. 6 shows an edge of the transistor and its $\Delta W$ characteristics. The active area of the MOSFET is provided in the silicon layer and extends substantially beneath silicon nitride layer and pad oxide layer, terminating at the edge.

As previously described, a conventional LOCOS isolation flow requires a boron implant around the silicon islands which will contain N-channel devices. The arrows above the MOSFET illustrate boron implantation into the transistor. With conventional LOCOS techniques, the oxidation step which creates the field oxide layer occurs after boron is implanted into the device as described in FIG. 4C. As a result, the time and temperature of this oxidation step can cause the implanted boron to laterally diffuse beyond the edge and into the active region of the MOSFET. The arrows under the pad oxide layer illustrate how the boron ions can diffuse from the edge deeply, or widely into the transistor.

Significant boron diffusion in a transistor is illustrated by its width, or $\Delta W$ characteristic as shown in FIG. 6. Because a significant amount of boron diffuses laterally during oxidation, away from the edge, the dose for the boron implant for conventional LOCOS isolation must be approximately $5 \times 10^{15}/cm^2$ to $10 \times 10^{15}/cm^2$, in order to maintain enough boron in the edge and to control edge leakage. Increasing the boron dose, however, can substantially increase the $\Delta W$. A typical $\Delta W$ characteristic for SOI technologies ranges from approximately 0.8 microns ($\mu$m) to 1.1 $\mu$m. Such a $\Delta W$ characteristic is unacceptable for highly integrated technology and for building minimally sized transistors.

High doses of boron lead to large $\Delta W$ characteristics which require significant transistor area, forcing overall transistor size to increase. An ideal minimal transistor width from a designer's point of view has a channel width of approximately 1.0 $\mu$m to 1.5 $\mu$m. The MOSFET in FIG. 6, which is typical of SOI LOCOS technology, is limited to a transistor width of approximately 2.5–3.0 $\mu$m. Such a width exceeds a designer's ideal minimal width requirement by at least a factor of two.

Figure 7:
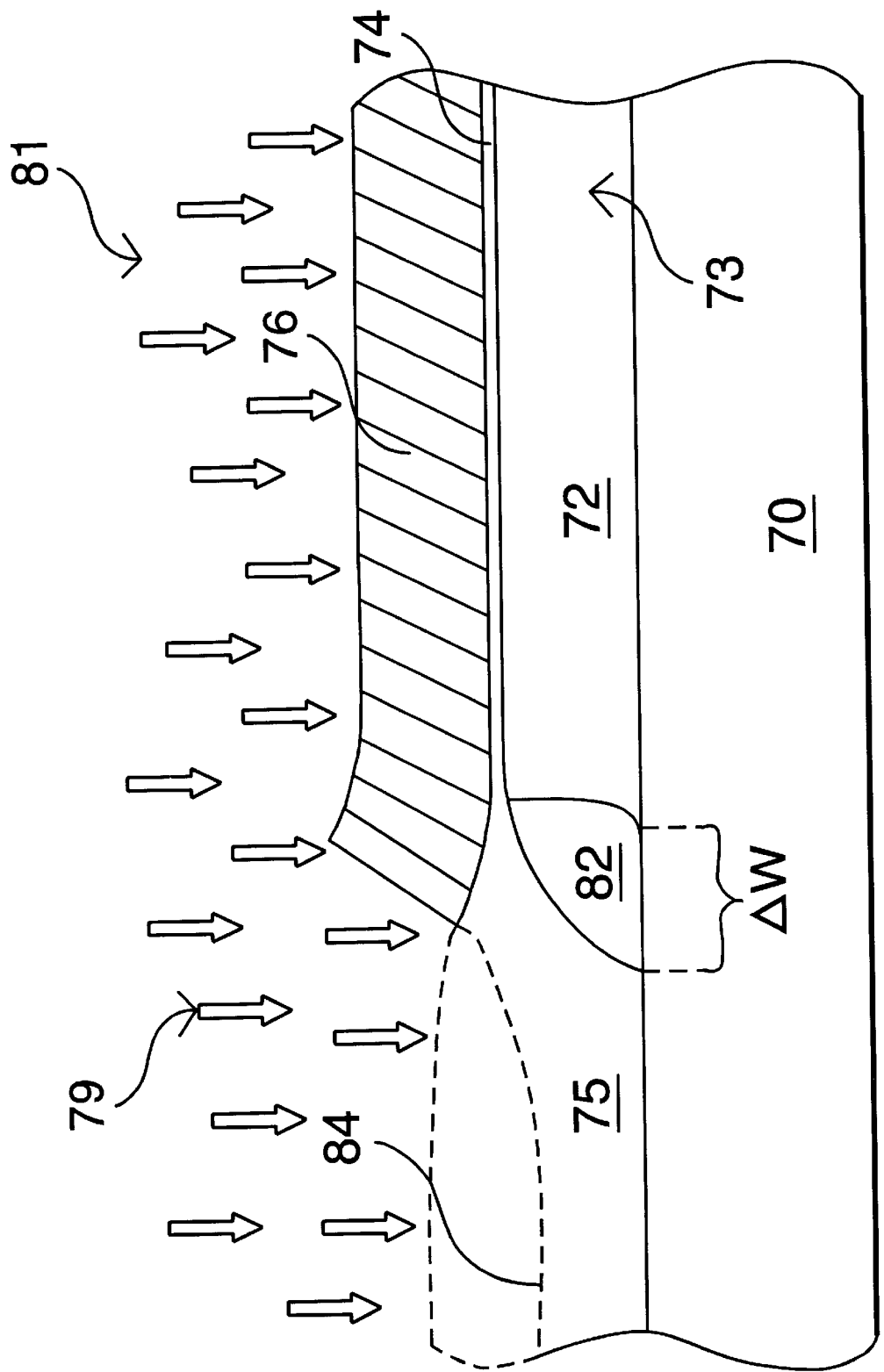
FIG. 7 shows a cross-sectional view of an N-channel MOSFET fabricated by the LOCOS process of FIGS. 5A–5C in either ultrathin silicon-on-sapphire or other forms of SOI, illustrating the significantly smaller ΔW characteristics according to an aspect of the present invention.

Referring to the present invention, the structure in FIG. 7 is the same cross sectional view of the structure shown in FIG. 5C, but is now illustrating only the NMOS side of the device, similar to FIG. 6. FIG. 7 shows how process conditions can be changed from present LOCOS techniques to increase control over boron diffusion under the edge of a MOSFET or similar transistor (CMOS; NMOS, etc.) fabricated in ultrathin silicon-on-sapphire technology and other forms of SOI technology.

FIG. 7 shows an N-channel MOSFET 81 similar to the MOSFET of FIG. 6. MOSFET 81 comprises a sapphire or other SOI substrate material 70, a thin silicon layer 72, a thin pad oxide layer 74, a silicon nitride ($Si_3N_4$) layer 76, a field oxide ($SiO_2$) 75, and an edge 82 of the transistor 81. All the layer thicknesses described in FIGS. 5A–5C of the present invention also apply to the layers in FIG. 7.

Arrows 79 illustrate boron implantation similar to conventional LOCOS isolation techniques. However, this embodiment of the invention differs from conventional LOCOS processing. Instead of implanting the boron prior to oxidation, when the field oxide layer is created, the present invention implants the boron ions after the oxidation step. That is, this aspect of the invention creates the field oxide layer 75 and then implants the boron ions.

In accordance with this embodiment, the $Si_3N_4$ layer 76 is used as a mask for the ion implantation step. The layer 76 blocks or acts as a barrier to the boron implant, allowing boron to diffuse sufficiently into the edge 82. Because the field oxide layer 75 is formed before the boron implant, the oxidation process does not cause lateral diffusion of the boron ions. As a result, the boron dose can be reduced to approximately $1 \times 10^{14}/cm^2$ to $10 \times 10^{14}/cm^2$ as compared to the $5 \times 10^{15}/cm^2$ to $10 \times 10^{15}/cm^2$ dose typical of SOI LOCOS processing. The reduced boron dosage dramatically decreases the $\Delta W$ characteristic to approximately 0.10$\mu$m to 0.15$\mu$m. The small $\Delta W$ characteristic enables much more precise process control over the edge of the MOSFET than is possible in conventional LOCOS processing. This characteristic also provides the advantage of greater flexibility in transistor design and the ability to fabricate MOSFETs which are subject to 10 times less the electrical narrowing of MOSFETs devised with conventional LOCOS isolation processes.

To enable the boron ions to pass first through the field oxide layer 75 and then on through the $Si_3N_4$ layer 76, the process must have the correct ion implant energy. In particular, an ion implant energy of typical SOI LOCOS processing is approximately 35 keV. However, this embodiment of the current invention uses an ion implant energy of about 50 keV. Other energies can be used according to the device specifications. The appropriate energy will depend on the starting film thickness of the silicon layer 72, the thickness of the field oxide 75, and the thickness of the nitride layer 76.

The appropriate ion implant energy can be determined empirically by one skilled in the art without undo experimentation as follows. In general, if the silicon layer 72 is approximately 500 Å or more, the field oxide layer 75 is more likely to require thinning because a thicker silicon layer grows a thicker field oxide, and so more must be stripped off. Consequently, the energy of the implant must be increased. If the silicon layer 72 is thinner than approximately 500 Å, the field oxide layer 75 is less likely to require thinning. FIG. 7 shows one example of stripping off the field oxide layer by a partial etch 84.

Also, in accordance with an aspect of the present invention, it has been found that thinner silicon layers will grow thinner field oxides. If the field oxide is thin enough, no partial stripping will be necessary.

It will be appreciated by one skilled in the art that no set ranges for various thicknesses of field oxide and nitride layers can be given due to the numerous variables involved in processing and stripping off the field oxide. A person having ordinary skill in the art can easily determine without undo experimentation how thick the silicon layer 72 should be by using computer simulation for typical implant models. A person of ordinary skill in the art can use modeling tools, such as a process simulator, which would determine parameters such as the partial etch of the field oxide, implant energy and dose of the boron, and the thickness of the nitride. Such computer simulation of implant models is well known and readily available.

In addition to significantly reducing the ΔW characteristic, the boron implant in accordance with an aspect of the invention, is self-aligned due to the $Si_3N_4$ layer 76 acting as a mask, similar to conventional LOCOS processing. However, the self-aligned aspect of the present invention is maintained throughout the process because the boron is held within the edge of the transistor. In contrast, the self-aligned aspect in conventional LOCOS processing is lost once boron diffusion occurs after the oxidation step.

Yet another advantage of the present invention is the significant time saved during processing steps for N-channel MOSFETs. In conventional SOI LOCOS processing, ion implantation takes approximately 20 to 60 minutes due to its large dose requirement. An aspect of the invention reduces the ion dose by a factor of 5 to 100. Thus, the ion implantation step of this aspect of the invention, takes approximately 30 to 120 seconds. This significant time savings during processing decreases fabrication cost. Also, the lower ion doses, according to this aspect of the invention, can result in reduced gate-to-substrate capacitances and improved PN-substrate junction breakdown voltages.

Figure 8:
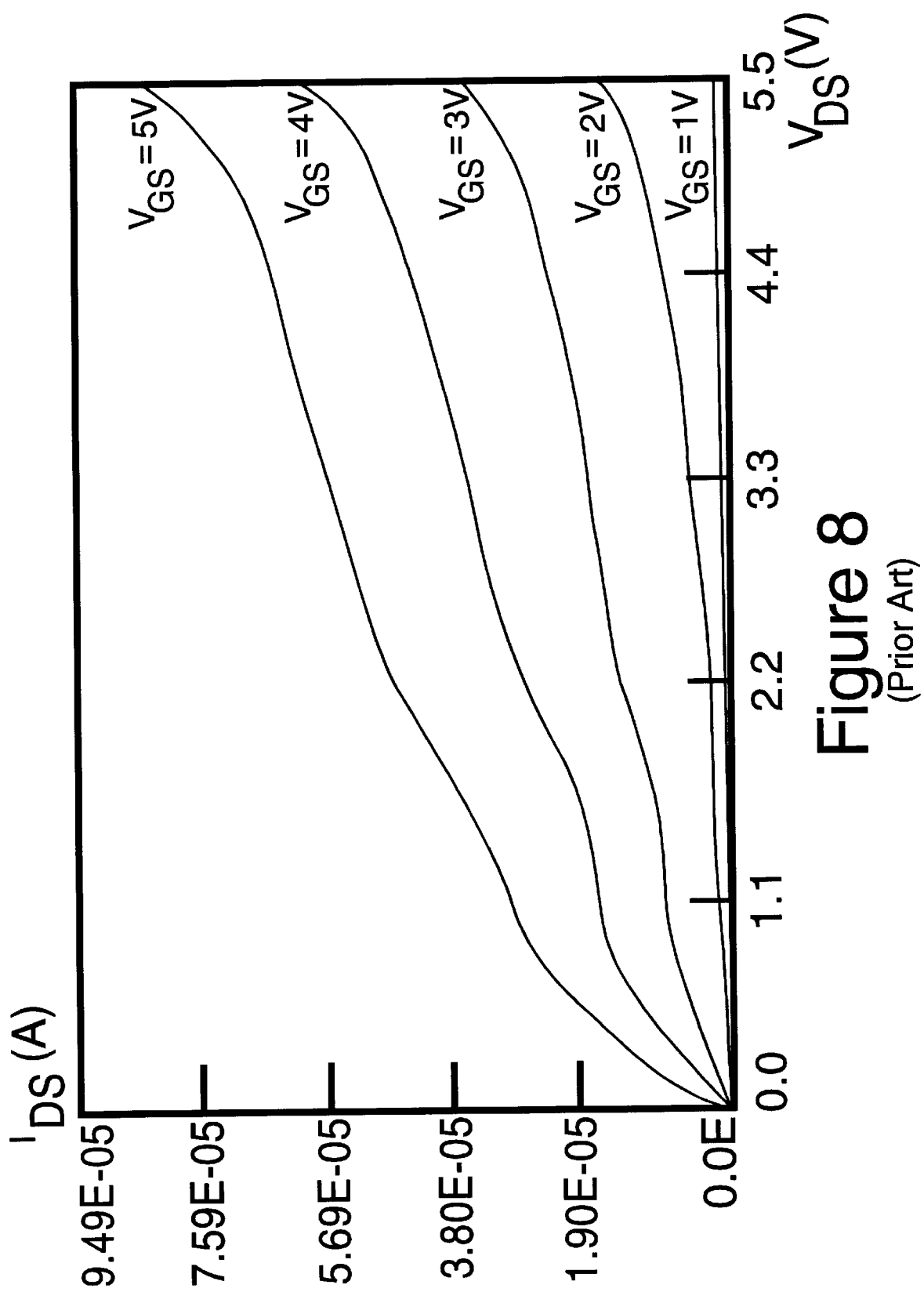
FIG. 8 shows a family of I–V plots for an ultrathin silicon-on-sapphire N-channel MOSFET with a large ΔW typical of conventional LOCOS technology.
Figure 9:
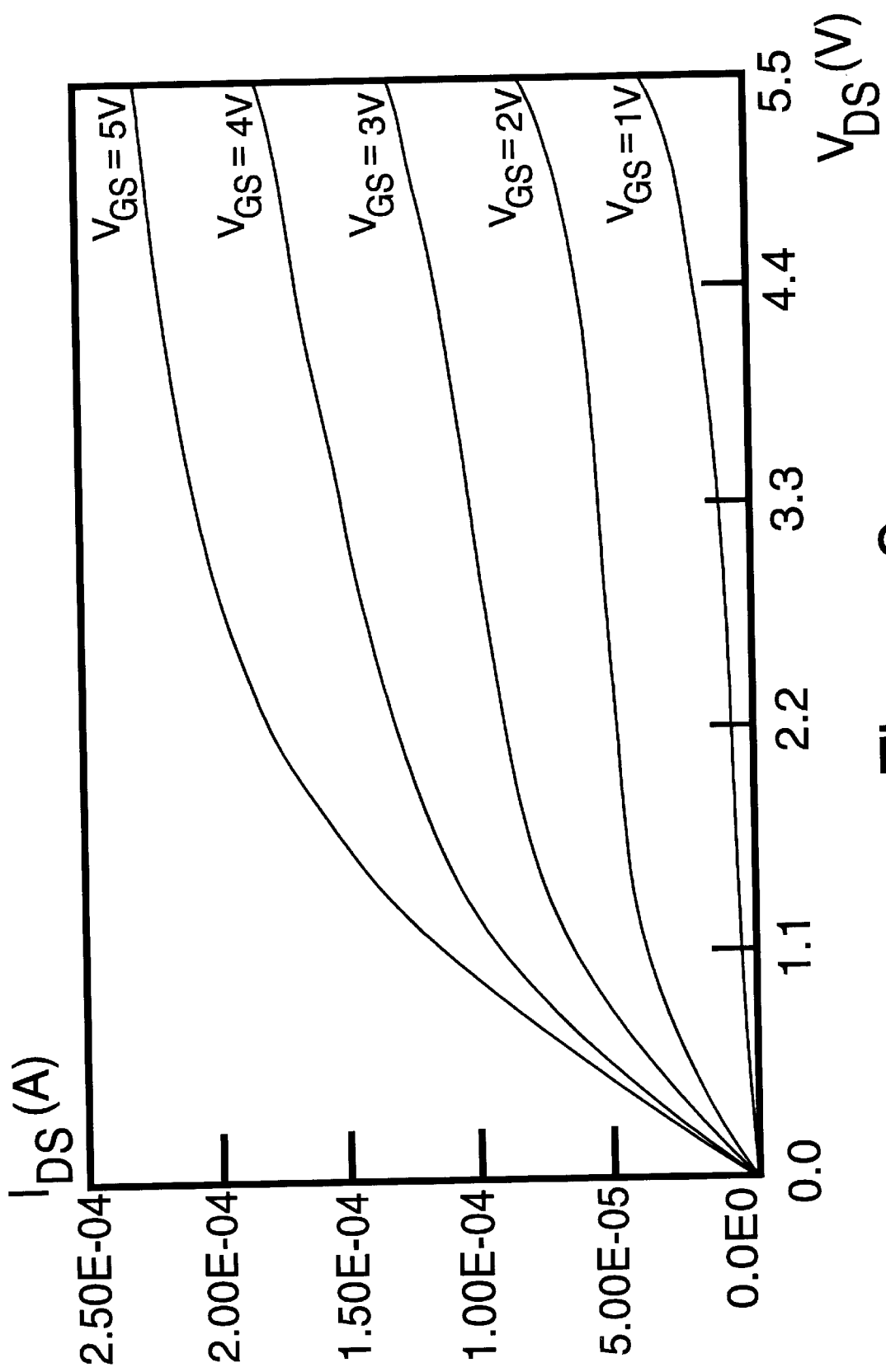
FIG. 9 shows a family of I–V plots for an ultrathin silicon-on-sapphire N-channel MOSFET with a significantly smaller ΔW fabricated in accordance with an aspect of the present invention.

FIGS. 8 and 9 show graphs of N-channel plots in ultrathin silicon-on-sapphire technology and enable a comparison of the performance of a transistor having large ΔW characteristics to the performance of a transistor having small ΔW characteristics fabricated in accordance with an aspect of the present invention.

The graph in FIG. 8 illustrates characteristics of an N-channel transistor in ultrathin silicon-on-sapphire manufactured according to conventional LOCOS processing as described in FIGS. 4A–4C. That is, ion implantation takes place prior to formation of a field oxide layer (oxidation). The N-channel transistor of FIG. 8 has an effective length ($L_{EFF}$) of 0.65 μm and a width of 1.0 μm. The curves in the graph show the drain current $I_{DS}$ as a function of drain voltage $V_{DS}$ for five values of gate voltage $V_{GS}$, 2.08 volts, 2.93 volts, 3.79 volts, 4.64 volts and 5.5 volts, respectively.

As previously described, the foregoing sequence of process steps result in a relatively large ΔW characteristic due to the lateral diffusion of boron beneath the edge of the transistor. Although the layout or design width for the transistor is 1.0 μm, the large ΔW creates an electrically narrower width, forcing the transistor to lose its drive capability.

The graph in FIG. 9 illustrates characteristics of an N-channel transistor fabricated in ultrathin silicon-on-sapphire manufactured according to an aspect of the present invention, wherein the field oxide is grown prior to ion implantation as described in FIGS. 5A–5C. The effective length LEFF of this transistor is also 0.65 μm and its layout width is also 1.0 μm. The curves in this graph, as in FIG. 8, show the drain current $I_{DS}$ as a function of drain voltage $V_{DS}$ for five values of gate voltage $V_{GS}$, 2.08 volts, 2.93 volts, 3.79 volts, 4.64 volts and 5.5 volts, respectively.

It will be appreciated that, because oxidation occurs before boron implantation, the ΔW characteristic is dramatically reduced. The reduced ΔW characteristic produces improved transistor operating parameters as shown in FIG. 9. In particular, the transistor of FIG. 9 exhibits four times the $I_{DS}$ current of the transistor of FIG. 8 for equivalent gate voltages.

It also will be appreciated that the above-described advantages of the present invention, including more precise process control over boron edge diffusion during LOCOS isolation in ultrathin silicon-on-sapphire and other forms of SOI technology, now enable transistors to display desirable operating characteristics even at greatly reduced sizes and high integration levels in VLSI applications. Such improved operating characteristics include greater drive capability and low off leakage, even at reduced dimensions.

Boron diffusion beyond the edge of a transistor does not typically pose a problem in P-channel MOSFETs manufactured by conventional LOCOS processing. However, the invention could be used with P-channel MOSFETs if required. This embodiment would be essentially the same as that used for N-channel MOSFETs. However, the P-channel MOSFET LOCOS process would implant phosphorous or arsenic ions instead of boron ions, for example. Also, during P-channel edge control, the N-channel would be blocked with photoresist where during N-channel edge control, the P-channel is blocked with photoresist.

A person having ordinary skill in the art will understand that the apparatus and method of the present invention for a self-aligned edge control in silicon-on-insulator may be employed with materials, process steps, or devices other than those described in this application. Thus, there are numerous other embodiments of the invention which will be obvious to one skilled in the art, including but not limited to changes in the dimensions of the regions forming the devices or the type of processes used to fabricate devices. It is understood that both N- and P-type MOSFETs can be made simultaneously on the same sapphire substrate, as shown throughout FIGS. 2 and 3, thereby comprising complimentary MOS (or CMOS) circuits.

Therefore, persons of ordinary skill in this field are to understand that all such equivalent structures are to be included within the scope of the following claims.

What is claim:

1. A method for isolating an active region of a semiconductor layer from another region of the semiconductor layer comprising the steps of:

providing a layer of silicon on an insulating substrate;

forming a pad oxide layer on the layer of silicon;

providing a layer of silicon nitride on the pad oxide layer;

providing a photoresist layer over a portion of the layer of silicon nitride such that the photoresist layer is adapted to define the active region in the silicon layer wherein the active region is adapted for forming a transistor;

removing selected portions of the silicon nitride layer as defined by the photoresist layer;

removing the photoresist layer to expose a silicon nitride mask that covers portions of the active region;

oxidizing portions of the silicon layer as allowed by the silicon nitride mask to form a field oxide such that the silicon layer is oxidized at least in part through to the insulating substrate and such that an edge of the active region extends between the field oxide and the insulating substrate; and implanting ions of a conductivity determining material in the edge of the active region after the portions of the silicon layer have been oxidized such that the ions are blocked by the silicon nitride mask from the portions of the active region that are covered by the silicon nitride mask and such that the ions are self-aligned in the edge of the active region by the silicon nitride mask.

2. The method of claim 1 wherein the step of providing the layer of silicon on the insulating substrate comprises the step of limiting the layer of silicon to a thickness of about 1,500 Å or less.

3. The method of claim 1 wherein the step of forming the pad oxide layer comprises the step of limiting the thickness of the pad oxide layer to a range of about 100–150 Å.

4. The method of claim 1 wherein the step of oxidizing the portions of the silicon layer comprises the step of thermally oxidizing the silicon layer at a temperature in a range of about 900° C.–1000° C.

5. The method of claim 1 wherein the step of providing a layer of silicon nitride further comprises the step of limiting the thickness of said silicon nitride layer to a range of about 750–2,000 Å.

6. The method of claim 1 wherein the step of implanting ions of a conductivity determining material further comprises the steps of:

providing a second layer of photoresist after the step of oxidizing portions of the silicon but before the step of implanting ions to block the ions of the conductivity determining material from selected regions in the layer of silicon;

implanting boron ions into unblocked regions of the field oxide and into the edge of the active region.

7. The method of claim 6 wherein the step of implanting boron ions further comprises implanting the boron ions having a dosage in a range of about $1\times10^{14}$/cm$^2$ to $10\times10^{14}$/cm$^2$ at an implantation energy having a range of about 35–65 keV.

8. A method for making a MOSFET characterized by a small $\Delta W$ characteristic comprising the steps of:

providing a substrate;

providing a semiconductor layer having a thickness of about 1,500 Å or less on the substrate, providing an oxidized layer having a thickness of at least about 100 Å on a portion of the semiconductor layer;

providing a silicon nitride layer having a thickness of at least about 750 Å on the oxidized layer;

defining an active region for the MOSFET transistor in the semiconductor layer by oxidizing portions of the semiconductor layer where the active region is not desired;

oxidizing the semiconductor layer to grow a field oxide through to the substrate at locations not covered by the silicon nitride layer wherein the field oxide is grown such that an edge of the active region extends between the field oxide and the insulating substrate; and implanting ions of a conductivity determining material through the field oxide into the edge of the active region such that the ions are self-aligned by the silicon nitride layer.

9. The method of claim 8 further comprising the step of thinning the field oxide after the step of oxidizing the semiconductor layer.

10. The method of claim 9 wherein the step of implanting ions of a conductivity determining material includes the step of implanting ions selected from the group consisting of boron, arsenic and phosphorus.

11. The method of claim 10 wherein the step of implanting ions of a conductivity determining material further comprises the step of implanting boron ions having a dosage in a range of about $1\times10^{14}$cm$^2$ to $10\times10^{14}$cm$^2$ at an implant energy of a 35–65 keV.

12. A method for isolating an active region in a semiconductor layer on an insulating substrate wherein the active region is adapted for use in a MOSFET, the method comprising:

providing the insulating substrate wherein the substrate has a major surface;

providing the semiconductor layer on the major surface of the insulating substrate;

providing the active region in the semiconductor layer;

providing a nitride mask that covers a portion of the active region and that defines an area of the active region for receiving ions of a conductivity determining material;

providing a field oxide adjacent to the defined area of the active region;

removing a portion of the field oxide layer;

after the step of removing the portion of the field oxide layer, implanting ions from the group consisting of boron, arsenic and phosphorus through the field oxide and into the defined area of the active region such that the implanted ions are self-aligned by the nitride mask.

13. The method of claim 12 wherein the step of implanting ions further comprises the step of implanting boron ions having a dosage in a range of about $1\times10^{14}$cm$^2$ to $10\times10^{14}$cm$^2$ at an implant energy of a 35–65 keV.

14. The method claim 1 wherein the insulating substrate comprises sapphire.

15. The method of claim 8, wherein the substrate comprises sapphire.

16. The method of claim 12 wherein the insulating substrate comprises sapphire.

* * * * *